(12) United States Patent
Kodama et al.

(10) Patent No.: US 11,183,550 B2
(45) Date of Patent: Nov. 23, 2021

(54) LIGHT-EMITTING DEVICE AND ELECTRONIC APPARATUS

(71) Applicant: SEIKO EPSON CORPORATION, Tokyo (JP)

(72) Inventors: Takumi Kodama, Chino (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 20 days.

(21) Appl. No.: 16/512,505

(22) Filed: Jul. 16, 2019

(65) Prior Publication Data

US 2020/0027942 A1 Jan. 23, 2020

(30) Foreign Application Priority Data

Jul. 17, 2018 (JP) .............................. JP2018-133890

(51) Int. Cl.
*H01L 27/32* (2006.01)
*H01L 51/52* (2006.01)

(52) U.S. Cl.
CPC ........ *H01L 27/3272* (2013.01); *H01L 27/322* (2013.01); *H01L 27/3206* (2013.01); *H01L 27/3223* (2013.01); *H01L 51/5265* (2013.01)

(58) Field of Classification Search
CPC combination set(s) only.
See application file for complete search history.

(56) References Cited

U.S. PATENT DOCUMENTS

| 2004/0041753 | A1* | 3/2004 | Nakanishi | ........... H01L 27/3211 345/76 |
| 2009/0115933 | A1* | 5/2009 | Mimura | ............ G02F 1/133606 349/59 |
| 2009/0195481 | A1* | 8/2009 | Taguchi | .................. G09G 3/20 345/55 |
| 2010/0289994 | A1* | 11/2010 | Nonaka | .................... G09G 3/20 349/108 |
| 2015/0102376 | A1* | 4/2015 | Toya | ..................... H01L 27/322 257/98 |
| 2016/0113106 | A1 | 4/2016 | Kim | |
| 2016/0211480 | A1 | 7/2016 | Hanari | |
| 2016/0314564 | A1 | 10/2016 | Jones et al. | |
| 2017/0288167 | A1 | 10/2017 | Hanari | |
| 2018/0166650 | A1 | 6/2018 | Hanari | |
| 2018/0277610 | A1* | 9/2018 | Kubota | ............... H01L 51/5237 |
| 2019/0013494 | A1 | 1/2019 | Hanari | |

FOREIGN PATENT DOCUMENTS

| JP | 2010-286825 A | 12/2010 |
| JP | 2012-003272 A | 1/2012 |
| JP | 2016-081031 A | 5/2016 |
| JP | 2016-134236 A | 7/2016 |
| JP | 2017-228141 A | 12/2017 |
| JP | 2018-078110 A | 5/2018 |
| WO | 2007/132574 A1 | 11/2007 |

\* cited by examiner

*Primary Examiner* — Sue A Purvis
*Assistant Examiner* — Jordan M Klein
(74) *Attorney, Agent, or Firm* — Oliff PLC

(57) ABSTRACT

The light-emitting device includes a display unit in which rectangular light-emitting pixels are arranged, and a light-shielding portion that defines a light-emitting region in the display unit and shields light in a region other than the light-emitting region of the display unit, and at least a part of a boundary between the light-emitting region and the light-shielding portion has a curved shape.

7 Claims, 15 Drawing Sheets

LIGHT-EMITTING DEVICE AND ELECTRONIC APPARATUS

The present application is based on, and claims priority from JP Application Serial Number 2018-133890, filed Jul. 17, 2018, the disclosure of which is hereby incorporated by reference herein in its entirety.

BACKGROUND

1. Technical Field

The present disclosure relates to a light-emitting device and an electronic apparatus.

2. Related Art

An organic electroluminescence (EL) device including an organic light-emitting element (OLED; Organic light-emitting Diode), for example, is known as a light-emitting device. The organic EL device is superior since that it has a simpler structure because a lighting device is unnecessary when compared to the liquid crystal display device, and that it is thin and has flexibility when an organic light-emitting element and a driving circuit are formed on a plastic substrate, and that it can realize a display device that is capable of taking various shapes.

For example, JP-A-2016-81031 discloses a display device in which a display unit including an organic light-emitting element in a pixel is circular-shaped. The organic light-emitting element is configured to include an anode electrode, an organic light-emitting layer disposed on the anode electrode, and a cathode electrode layer disposed on the organic light-emitting layer. Accordingly, the organic light-emitting layer emits light according to a data current supplied from a drive transistor with respect to the organic light-emitting element described above, and video is displayed.

Further, for example, JP-A-2010-286825 discloses an image display device including an image display region that includes an end unit pixel composed of end sub pixels for each of a plurality of primary colors arranged at an edge of a region in which a color image is displayed, and an internal unit pixel composed of internal sub pixels for each of the plurality of primary colors arranged inside the end unit pixel, wherein the end unit pixel is set to have a smaller area than the internal unit pixel, and the end sub pixels are set such that the area ratio of each of the plurality of primary colors is equal to that of the internal sub pixels, and according to an outer edge position of the image display region, a parallel direction of the end sub pixels is made different from a parallel direction of the internal sub pixels.

According to such the image display device, an image with the same color balance as inside can be displayed at the end of the non-rectangular image display region. Further, as an example of an image display device, not only a liquid crystal display device but also a self-emission type including an EL element in a sub pixel may be included.

According to the display device of JP-A-2016-81031 described above, the pixels arranged in the display unit are rectangular, and the outer edge of the display unit actually has a stepped shape due to an arrangement of the pixels that are rectangular. Therefore, the outer edge of the stepped shape of the display unit is visually recognized, and there is a possibility that an uncomfortable feeling may be felt about the display.

On the other hand, in order to mitigate the stepped shape at the outer edge of the display unit, as disclosed in JP-A-2010-286825 described above, according to the outer edge position of the image display region it is conceivable to arrange the end sub pixels having a smaller area than that of the internal sub pixels. However, when the sub pixels are configured to include the EL elements, in the end sub pixels, current values for light emission to be controlled for the internal sub pixels are different. Thus, there is a problem that a luminance difference will occur between the end sub pixels and the internal sub pixels, causing display unevenness.

SUMMARY

The light-emitting device of the present application includes a display unit in which rectangular light-emitting pixels are arranged, and a light-shielding portion defining a light-emitting region in the display unit and shielding light in a region other than the light-emitting region of the display unit, and at least a part of a boundary between the light-emitting region and the light-shielding portion has a curved shape.

In the light-emitting device described above, the light-emitting pixels may include light-emitting elements, the light-emitting device may include a sealing film covering the light-emitting element, and the light-shielding portion may be disposed at the sealing film.

In the light-emitting device described above, the light-emitting pixels in the light-emitting region include colored layers in color selected from at least red, green, and blue, and arranged at the sealing film, and the light-shielding portion is formed by laminating the colored layers of a plurality of colors on the sealing film.

In the light-emitting device described above, the light-emitting element may include a first electrode, a second electrode functioning as a common electrode, and a light-emitting function layer arranged between the first electrode and the second electrode, the light-emitting device may include a second electrode contact portion outside a region in which the light-emitting pixels are arranged.

Further, in the light-emitting device described above, the second electrode contact portion may be equidistantly arranged from the light-emitting pixels arranged at an outer peripheral side of the light-emitting region.

Further, in the light-emitting device described above, the second electrode contact portion may include an electrode provided at a layer where the first electrode of the light-emitting device is disposed, and the electrode and the second electrode may be in contact with each other with the second electrode contact portion.

In the light-emitting device described above, the display unit may include a dummy pixel arranged between an outer edge of the region in which the light-emitting pixels are arranged and the second electrode contact portion and the dummy pixel may include the light-emitting element same as that of the light-emitting pixel and has an insulating film disposed between the first electrode and the light-emitting function layer.

Further, in the light-emitting device described above, an outer edge of the light-emitting function layer may be located between the second electrode contact portion and an outer edge of a region in which the light-emitting pixels are arranged.

An electronic apparatus according to the present disclosure includes the electro-optical device described above.

DESCRIPTION OF EXEMPLARY EMBODIMENTS

Figure 1:
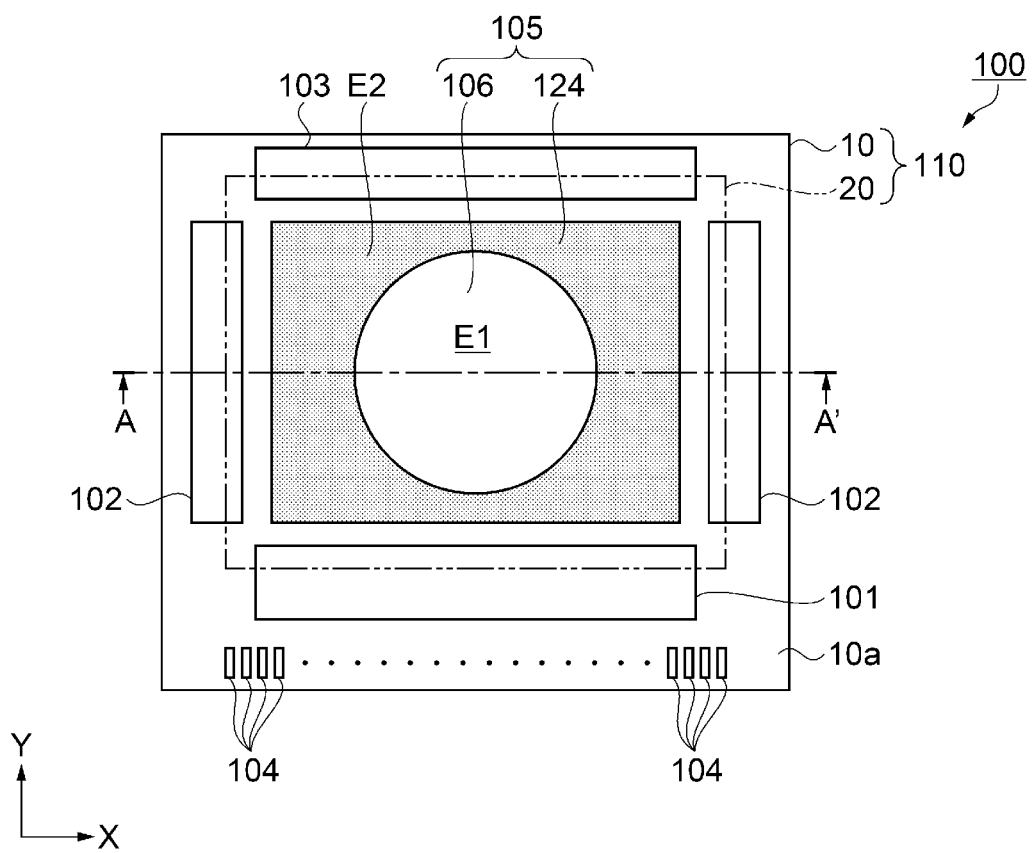
FIG. 1 is a schematic plan view illustrating a configuration of a light-emitting device according to a first exemplary embodiment.

Hereinafter, exemplary embodiments of the present disclosure will be described below with reference to the accompanying drawings. Note that, in the drawings referred to below, the parts described are illustrated in an enlarged or reduced state as appropriate so that those parts can be easily recognized.

First Exemplary Embodiment

Figure 2:
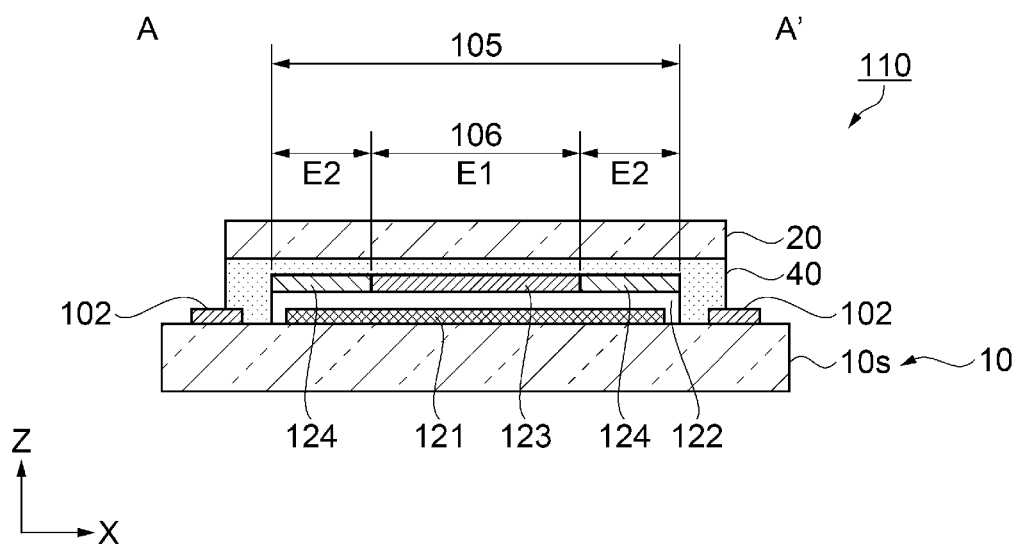
FIG. 2 is a schematic cross-sectional view illustrating a structure of a light-emitting device according to the first exemplary embodiment.

Light-Emitting Device A basic configuration of a light-emitting device according to the present exemplary embodiment will be described with reference to FIG. 1 and FIG. 2. FIG. 1 is a schematic plan view illustrating a configuration of the light-emitting device of the first exemplary embodiment, and FIG. 2 is a schematic cross-sectional view illustrating a structure of the light-emitting device of the first exemplary embodiment. Note that, line A-A' illustrated in FIG. 1 is a line segment crossing the center of a light-emitting portion 106 of the light-emitting device 100.

As illustrated in FIG. 1 and FIG. 2, the light-emitting device 100 of the present exemplary embodiment includes a light-emitting panel 110 including an element substrate 10 and a counter substrate 20 that is light-transmissive and that is arranged opposite the element substrate 10. A display unit 105 including a light-emitting portion 106 and a light-shielding portion 124 is disposed in the element substrate 10. A detailed configuration of the display unit 105 is described later, but a plurality of light-emitting pixels is arranged in the display unit 105. The light-emitting pixel includes a light-emitting element, and a data line driving circuit 101 and a scanning line driving circuit 102 are disposed in the periphery of the display unit 105 as a driving circuit for driving the light-emitting element. The light-emitting device 100 is an active drive type in which the light-emitting elements disposed in the light-emitting pixels can be individually driven.

The element substrate 10 is slightly larger than the counter substrate 20, and a plurality of external connection terminals 104 for connecting to an external driving circuit are aligned in a terminal portion 10a, which is a side part of the element substrate 10 protruding from the counter substrate 20. The data line driving circuit 101 is disposed between the plurality of external connection terminals 104 and the display unit 105. The scanning line driving circuit 102 is disposed between the display unit 105 and each of the two opposing side parts orthogonal to the terminal portion 10a of the element substrate 10. An inspecting circuit 103 is disposed between the side part of the element substrate 10 opposite the terminal portion 10a and the display unit 105. The inspecting circuit 103 is configured to be capable of detecting a data signal supplied to each of the plurality of light-emitting pixels from the data line driving circuit 101, and inspecting whether each of the plurality of light-emitting pixels is operating normally. The data line driving circuit 101 and the scanning line driving circuit 102 as the driving circuit, and an inspecting circuit 103 are referred to as peripheral circuits.

In the present exemplary embodiment, a region in which light emission (display light) is obtained from the display unit 105 is referred to as a light-emitting region E1, and a light-shielding portion 124 is provided in a region other than the light-emitting region E1 in the display unit 105. The region in which the light-shielding portion 124 is disposed will be called a light-shielding region E2 hereinafter. In the present exemplary embodiment, an outline of the display unit 105 is a rectangle (rectangular shape), and an outline of the light-emitting region E1 is a circle having a shape different from a rectangle. The light-emitting region E1 is disposed substantially at the center of the display unit 105.

Hereinafter, a direction in which the plurality of external connection terminals 104 are aligned in the terminal portion 10a of the element substrate 10 will be described as an X direction, and a direction orthogonal to the X direction on the element substrate 10 will be described as the Y direction. Further, a direction that is orthogonal to the X direction and the Y direction and oriented from the element substrate 10 toward the counter substrate 20 will be described as a Z direction. Additionally, a view from the counter substrate 20 side along the Z direction is referred to as a plan view.

As illustrated in FIG. 2, the element substrate 10 and the counter substrate 20 are bonded via a filler 40 made of light-transmissive material, for example, an epoxy-based resin. The filler 40 is arranged so as to cover the display unit 105 and to partially overlap the peripheral circuit including the scanning line driving circuit 102.

An element portion 121 including a plurality of light-emitting elements, a sealing film 122 covering the element portion 121, and a color filter 123 arranged on the sealing film 122 corresponding to the light-emitting pixels are disposed in the element substrate 10. Further, a light-shielding portion 124 is disposed on the sealing film 122 in the light-shielding region E2 surrounding the light-emitting region E1. The element portion 121 is disposed so as to overlap the color filter 123 and the light-shielding portion 124 in a plan view. That is, light emitted from the light-emitting element of the element 121 that forms the light-emitting portion 106 is transmitted through the sealing film 122 and the color filter 123 and emitted from the counter substrate 20 side. The display unit 105 includes the element portion 121, the sealing film 122, the color filter 123, and the light-shielding portion 124, and details of these configurations will be described later. Note that, in the present exemplary embodiment, a semiconductor substrate such as a silicon substrate is used as a base material of the element substrate 10 in which the element portions 121 are formed.

In this light-emitting panel 110, a driving line for electrically coupling the data line driving circuit 101 and the scanning line driving circuit 102 as the driving circuit for driving the light-emitting element in the element portion 121 is disposed in the display unit 105. A detailed configuration of the driving line will be described later.

Figure 3:
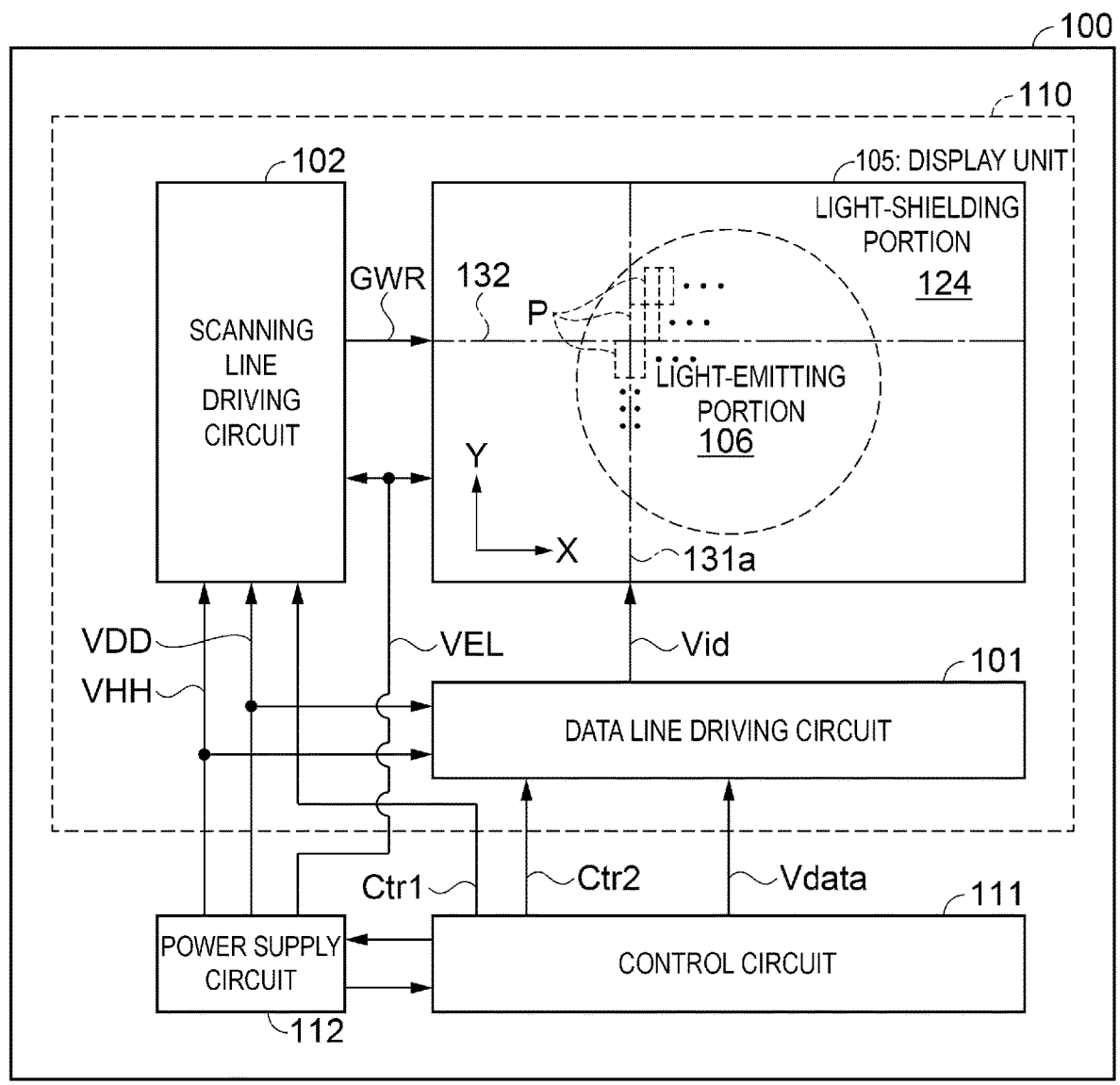
FIG. 3 is a circuit block diagram illustrating an electrical configuration of the light-emitting device of the first exemplary embodiment.
Figure 4:
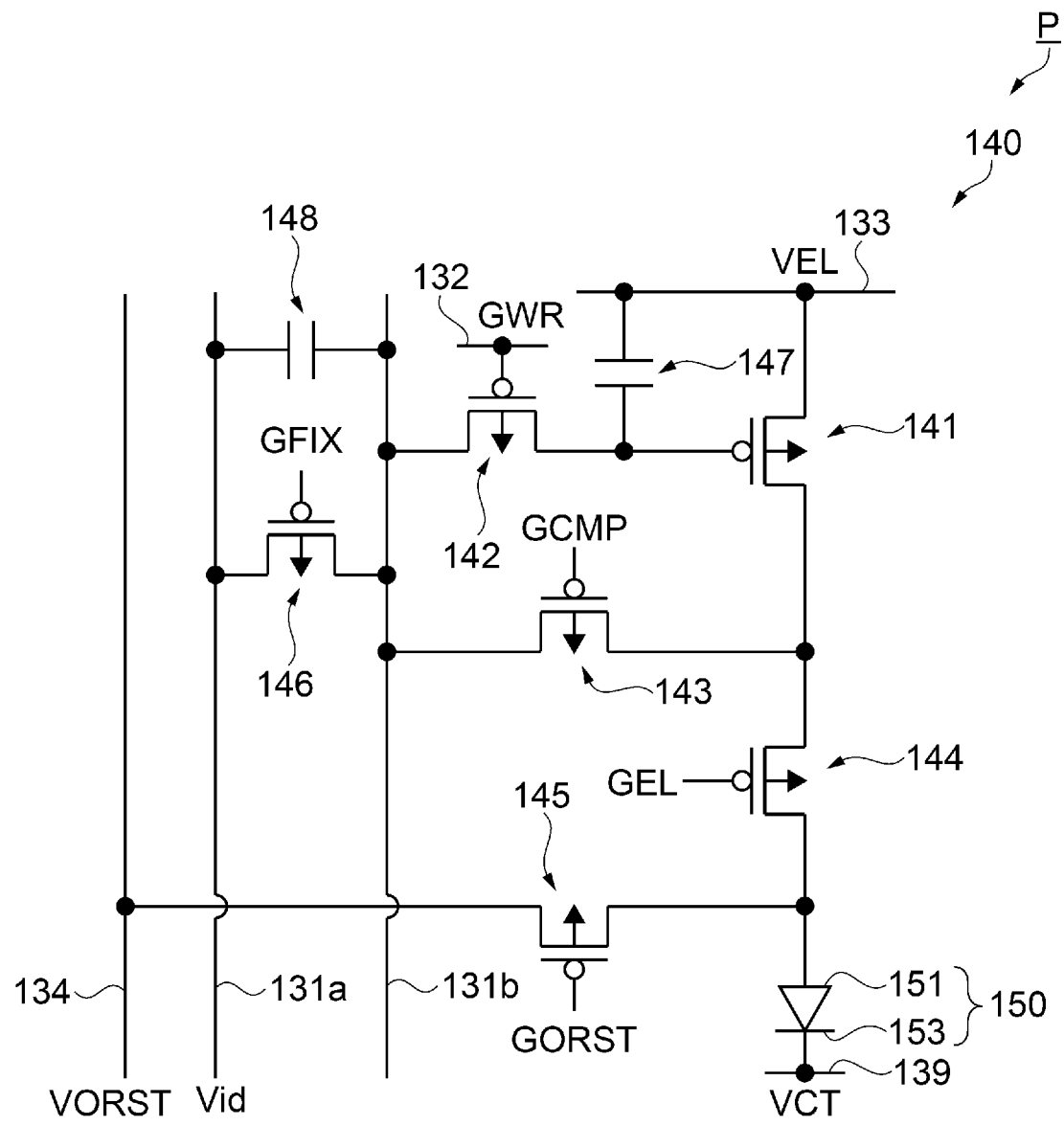
FIG. 4 is an equivalent circuit diagram illustrating a pixel circuit in a light-emitting pixel of the first exemplary embodiment.
Figure 5:
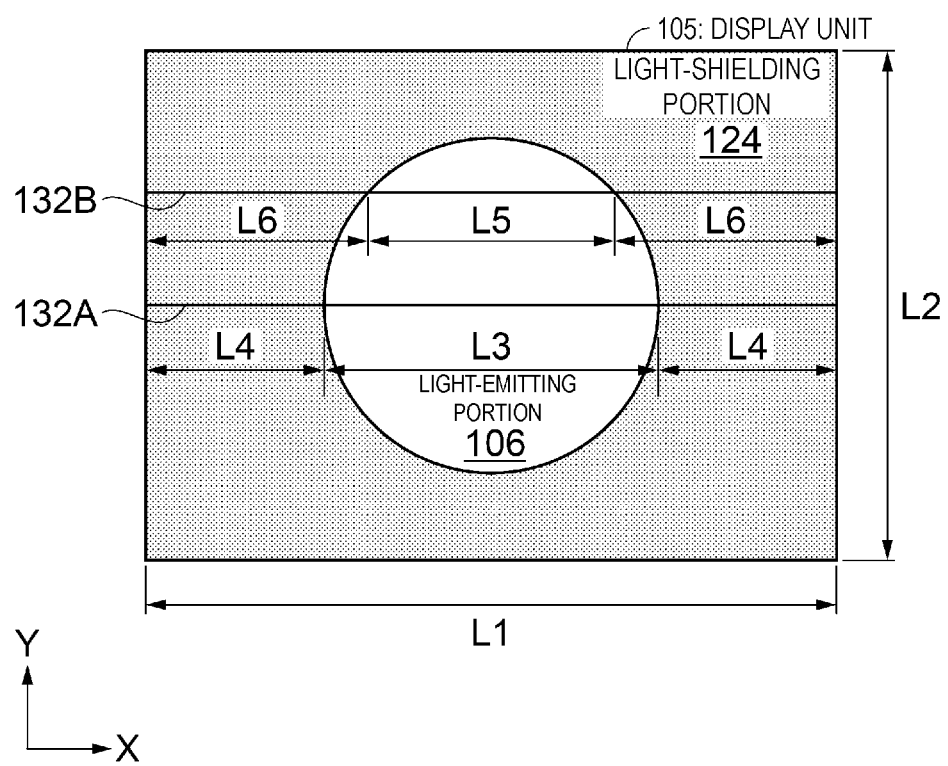
FIG. 5 is a schematic plan view illustrating an arrangement of data lines in a display unit.

Electrical Configuration of Light-Emitting Device Next, an electrical configuration of the light-emitting device 100 will be described with reference to FIG. 3 and FIG. 5. FIG. 3 is a circuit block diagram illustrating an electrical configuration of the light-emitting device of the first exemplary embodiment, FIG. 4 is an equivalent circuit diagram illustrating a pixel circuit in the light-emitting pixel of the first exemplary embodiment, and FIG. 5 is a schematic plan view illustrating an arrangement of driving lines in the display unit.

As illustrated in FIG. 3, the light-emitting device 100 includes a display unit 105 including a light-emitting portion 106 and a light-shielding portion 124, and a light emission panel 110 including a data line driving circuit 101, and a scanning line driving circuit 102. Further, the light-emitting device includes a control circuit 111 and a power supply circuit 112 which serve as the external driving circuit coupled to the light emission panel 110 via the external connection terminal 104 described above (see FIG. 1). Note that in the circuit block diagram of FIG. 3, the inspecting circuit 103 illustrated in FIG. 1 is omitted.

Light-emitting pixels P are arranged in the display unit 105 across the X direction and the Y direction. When the X direction is the row direction and the Y direction is the column direction, n light-emitting pixels p in the row direction and m light-emitting pixels in the column direction are aligned in the display unit 105. Accordingly, driving lines for supplying various signals are arranged corresponding to the plurality of light-emitting pixels p in n column×m rows aligned in the display unit 105. Further, in the present exemplary embodiment, three light-emitting pixels P aligned in the X direction (row direction) serve as one display unit pixel configured to obtain the light emission of red (R), green (G), and blue (B) from the display unit pixel.

This enables color display in the light-emitting portion 106 surrounded by the light-shielding portion 124.

The control circuit 111 supplies a control signal Ctr1 to the scanning line driving circuit 102 and a control signal Ctr2 to the data line driving circuit 101. Further, the control circuit 111 supplies image data Vdata corresponding to the light-emitting pixels P in each row of the display unit 105 to the data line driving circuit 101 for each row. Further, the control circuit 111 controls generation of various power supply voltages by the power supply circuit 112.

The control signal Ctr1 is a pulse signal for controlling the scanning line driving circuit 102 and includes a vertical synchronization signal, a horizontal synchronization signal, a clock signal, and an enable signal. The control signal Ctr2 includes a horizontal synchronization signal, a sampling signal, a dot clock signal, a latch pulse signal, and an enable signal for controlling the data line driving circuit 101. The image data Vdata is a digital signal corresponding to a gradation value (gray level) for each of the light-emitting pixels P in a row selected by a scanning signal GWR transmitted from the scanning line driving circuit 102 to the display unit 105.

The scanning line driving circuit 102 generates, based on the control signal Ctr1, the scanning signal GWR for sequentially selecting and operating pixel circuits 140 (see FIG. 4) for each row of light-emitting pixels P in each frame period defined by the vertical synchronization signal. The scanning signal GWR is supplied to the pixel circuit 140 of the light-emitting portion 106 via a scanning line 132 disposed in the display unit 105 and extending in the X direction. Note that, in addition to the scanning signal GWR, the scanning line driving circuit 102 generates various control signals to be supplied to the pixel circuit 140 for each row, but the control signals are omitted in FIG. 3. Although a detailed configuration of the scanning line driving circuit 102 is not illustrated in FIG. 3, a known circuit configuration may be adopted, and is configured to include, for example, a shift register, a latch circuit, a demultiplexer, and the like.

The data line driving circuit 101 generates, based on the image data Vdata and the control signal Ctr2, an n-column of the data signal Vid corresponding to a gradation value of each of the light-emitting pixels P in the row selected by the scanning line driving circuit 102 for each horizontal scanning period. The data signal Vid is supplied to the pixel circuit 140 of the light-emitting portion 106 via a first data line 131a disposed in the display unit 105 and extending in the Y direction. Although the detailed configuration of the data line driving circuit 101 is not illustrated in FIG. 3, a known circuit configuration may be adopted, and is configured to include, for example, a shift register, a data latch circuit, a line latch circuit, a D/A (digital/analog) conversion circuit, a demultiplexer, and the like.

The power supply circuit 112 generates and supplies the various power supply voltages required for driving in each of the display unit 105 (pixel circuit 140 of the light-emitting pixel P), the data line driving circuit 101, the scanning line driving circuit 102, and the control circuit 111. Further, the power supply circuit 112 not only supplies the power supply potential related to driving to the data line driving circuit 101, but also supplies a plurality of levels of gradation reference voltage corresponding to the gradation value of the light-emitting pixel P.

The power supply potential generated by the power supply circuit 112 is VDD, VHH, and VEL. VDD is a low voltage (for example, 1.8V) for logic. VHH is a high voltage (for example, 5.5V) for logic and amplifier. VEL is a supply voltage (for example, 5.5V as VHH) to the pixel circuit 140

(see FIG. 4). Note that, in addition to the above, the power supply circuit 112 generates a reference potential VSS, a cathode potential VCT of the pixel circuit 140, a reset voltage VORST (see FIG. 4), and the like, which are omitted from FIG. 3.

As illustrated in FIG. 4, the pixel circuit 140 in the light-emitting pixel P is disposed corresponding to the intersection between the first data line 131a extending in the Y direction and the scanning line 132 and the power supply line 133 extending in the X direction, and is configured to include six P-type Metal-Oxide Semiconductor Field-Effect Transistors (MOSFET) 141 to 146, two storage capacitors 147, 148, and a light-emitting element 150. Hereinafter, for convenience of explanation, the six P-type MOSFETs are referred to as a first transistor 141, a second transistor 142, a third transistor 143, a fourth transistor 144, a fifth transistor 145, and a sixth transistor 146. A second data line 131b and a potential line 134 are disposed in parallel with the first data line 131a. A reset voltage VORST is supplied from the power supply circuit 112 to the potential line 134. The first data line 131a and the scanning line 132 are an example of a driving line for driving the pixel circuit 140.

The first transistor 141 functions as a drive transistor, and one of the source or the drain is coupled to the power supply line 133, and the other is coupled to one of the source or drain of the third transistor 143 and the fourth transistor 144. Further, the gate of the first transistor 141 is coupled to one of the source or drain of the second transistor 142. The storage capacitor 147 is coupled between the gate of the first transistor 141 and the power supply line 133. A power supply potential VEL is supplied from the power supply circuit 112 as described above to the power supply line 133. That is, the storage capacitor 147 functions as a retention capacitor of the gate potential of the first transistor 141 with respect to the power supply potential VEL.

The second transistor 142 functions as a write transistor, and the other one of the source or the drain is coupled to the second data line 131b. The second transistor 142 is controlled in selection/non-selection by the scanning signal GWR supplied to the gate via the scanning line 132. Note that, the scan line 132 is coupled to the scanning line driving circuit 102.

The third transistor 143 functions as a threshold compensation transistor, and is controlled in ON/OFF by a control signal GCMP supplied to the gate.

The fourth transistor 144 functions as a current supply control transistor, one of the source or the drain is coupled to the other one of the source or drain of the first transistor 141 and one of the source or drain of the third transistor 143. The other one of the source or drain of the fourth transistor 144 is coupled to an anode electrode (anode) 151 as the first electrode of the light-emitting element 150. A control signal GEL is supplied to the gate to control ON/OFF of the fourth transistor 144. For example, with the fourth transistor 144, it is possible to prevent current from flowing to the light-emitting element 150 and causing unintentional emission after power up of the light-emitting device 100.

The fifth transistor 145 functions as a reset transistor, and one of the source or the drain is coupled to the other one of the source or drain of the fourth transistor 144. The other one of the source or drain of the fifth transistor 145 is coupled to the potential line 134. A control signal GORST is supplied to the gate to control ON/OFF of the fifth transistor 145. As described above, the reset voltage VORST is supplied from the power supply circuit 112 to the potential line 134.

One of the source or the drain of the sixth transistor 146 is coupled to the first data line 131a, and the other one is coupled to the second data line 131b. A control signal GFIX is supplied to the gate to control ON/OFF of the sixth transistor 146. The data signal Vid is supplied to the first data line 131a from the data line driving circuit 101. A storage capacitor 148 is connected between the first data line 131a and the second data line 131b. That is, the storage capacitor 148 functions as a transfer capacitor of the data signal Vid transferred from the first data line 131a to the second data line 131b by the sixth transistor 146.

Note that, although not illustrated in detail in FIG. 4, the number dividing the total number m of light-emitting pixels in the Y direction of the display unit 105 by q, which is an arbitrary number, is arranged for each row. That is, by controlling the sixth transistor 146 as the number of pixel circuits 140 attached to one second data line 131b is set to q, which is an arbitrary number, the data signal Vid can be supplied to the pixel circuit 140 from the first data line 131a for each of the q light-emitting pixels P grouped in the column direction. For example, when the total number of light-emitting pixels m is 720 and q is 90, 90 pixel circuits 140 are attached to one second data line 131b, and eight second data lines 131b are arranged per row in the X direction.

As described above, the anode electrode 151 of the light 150 is coupled to the other one of the source or drain of the fourth transistor 144 and one of the source or drain of the fifth transistor 145. A cathode electrode 153 as a second electrode that is provided across the plurality of light-emitting elements 150 and that serves as a common electrode is coupled to a cathode wiring 139. The cathode electrode potential VCT is supplied to the cathode wiring 139 from the power supply circuit 112. The cathode electrode potential VCT may be a reference potential VSS (for example, 0V as ground potential).

The light-emitting element 150 is an organic light-emitting diode having a light-emitting function layer between the anode electrode 151 as a first electrode and the cathode electrode 153 as the second electrode. When a current flows between the anode 151 and the cathode 153, excitons (a state where a hole and an electron bind to each other under Coulomb force) are formed by the holes injected from the anode 151 and the electrons injected from the cathode 153, and when the excitons decay (that is, when the holes and the electrons recombine), some of the resulting energy is radiated as fluorescence or phosphorescence. In the present exemplary embodiment, it is configured that white light is emitted from the light-emission function layer.

The first transistor 141 and the light-emitting element 150 are connected in series between the power supply line 133 and the cathode wiring 139. The first transistor 141 is a drive transistor, and controls the current flowing in the light-emitting element 150 according to the gate potential. In other words, the first transistor 141 functions as a current source. The ON/OFF of the light-emitting element 150 is controlled by the fourth transistor 144, and the amperage of current flowing in the light-emitting 150 is controlled by the first transistor 141. The second transistor 142, the third transistor 143, the fourth transistor 144, and the sixth transistor 146 are used to control the potential of the node in the pixel circuit 140. As a result, it is configured that the light emission corresponding to a predetermined gradation value (gray scale level) is obtained from the light-emitting 150 at a predetermined timing based on the data signal Vid supplied from the data line driving circuit 101 via the first data line 131a to the pixel circuit 140. Note that the pixel circuit 140 for the driving of the light-emitting element 150 is not limited to a configuration including the first transistor 141 to the sixth transistor 146. For example, a configuration may be adopted in which the second transistor 142 and the third transistor 143 are coupled to the first data line 131*a* by deleting the second data line 131*b*, the sixth transistor 146, and the storage capacitor 148. The light-emitting element 150 emits light at a luminance corresponding to the current flowing to the light-emitting element 150, thus, in order to perform high accuracy gradation control, it may be a configuration including a drive transistor serving as a current source.

Next, the configuration of the driving lines in the display unit 105 will be described with reference to FIG. 5. As illustrated in FIG. 5, the display unit 105 is a rectangle in which the length L1 in the X direction of the outline is longer than the length L2 in the Y direction. The display unit 105 includes the light-emitting portion 106 and the light-shielding portion 124, and the light-emitting portion 106 having a circular outline is located at the center of the display unit 105 in the X direction and the Y direction. A description will be given of a scanning line 132 as an example of a driving line. As described above, the scanning line 132 is disposed extending in the X direction corresponding to each light-emitting element 150 of the plurality of light-emitting pixels P arranged in the display unit 105. Therefore, the length in the X direction of the scanning line 132 in the display unit 105 is L1. For example, a scanning line 132A passing through the center of the light-emitting portion 106 (in other words, the center of the display unit 105) having the longest length L3 in the light-emitting portion 106, and the length in the light-shielding portion 124 is the shortest 2×L4. The length L1 in the X direction of the scanning line 132A forms a relationship of L1=L3+2×L4. In contrast, the scanning line 132B located at a position offset in the Y direction from the center of the light 106 has a length L5 less than L3 in the light-emitting portion 106, and has a length 2×L6 greater than 2×L4 in the light-shielding portion 124. The length L1 of the scanning line 132B in the X direction at a position outside the center of the light-emitting portion 106 forms a relationship of L1=L5+2×L6.

That is, since the display unit 105 is a rectangle, the length of the scanning line 132 extending in the X direction is constant at L1, and the light-emitting portion 106 has a circle shape different from the rectangle, thus, the shorter the length of the part of the scanning line 132 in the light-emitting portion 106, the longer the length of the part of the scanning line 132 in the light-shielding portion 124 becomes. Although not illustrated in FIG. 5, a configuration of the first data line 131*a* as the driving line in the display unit 105 is the same as the scanning line 132, since the display unit 105 is a rectangle, the length of the first data line 131*a* extending in the Y direction is constant at L2, and the light-emitting portion 106 has a circle shape different from the rectangle, thus, the shorter the length of the part of the first data line 131*a* in the light-emitting portion 106, the longer the length of the part of the first data line 131*a* in the light-shielding portion 124 becomes.

Note that a relative position of the light-emitting portion 106 with respect to the display unit 105 is not limited to being located at the center of the display unit 105. In this case, technical features regarding the length of the driving line described above in the light-emitting portion 106 and the light-shielding portion 124 are also included.

Configuration of Display Unit

Figure 6:
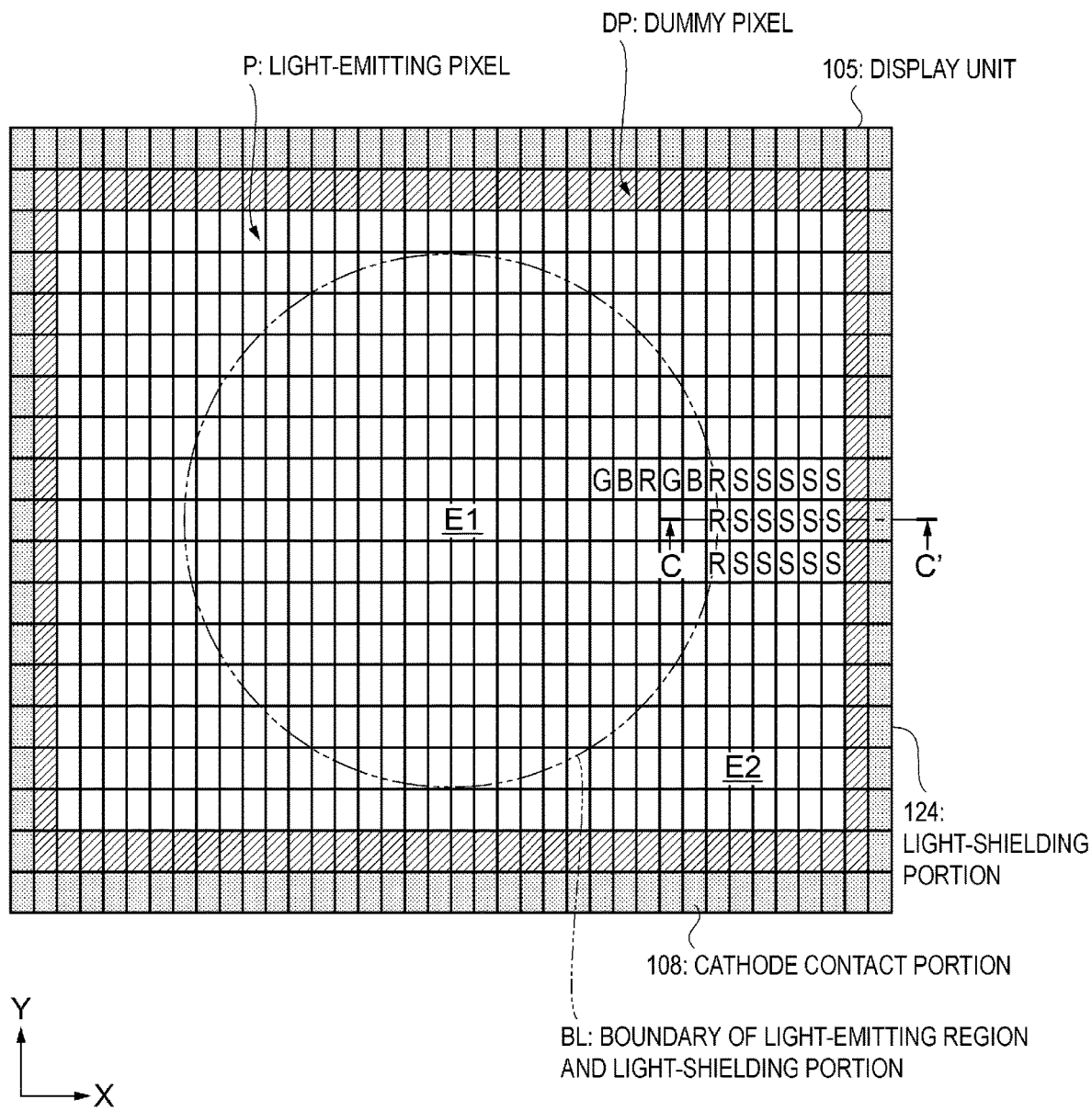
FIG. 6 is a schematic plan view illustrating a configuration of the display unit in the light-emitting device of the first exemplary embodiment.

Next, a configuration of the display unit 105 will be described with reference to FIG. 6. FIG. 6 is a schematic plan view illustrating a configuration of the display unit in the light-emitting device of the first exemplary embodiment. In FIG. 6, a configuration of a lower layer of the light-shielding portion 124 is illustrated for convenience of recognizing, and a boundary BL between the light-emitting region E1 and the light-shielding region E2 in which the light-shielding portion 124 is arranged is indicated by a two-dot chain line.

As illustrated in FIG. 6, the outline of the display unit 105 is a rectangle long in the X direction. In addition, an outline of the light-emitting pixel P is a rectangle long in the Y direction. As described above, a plurality of rectangular light-emitting pixels P are arranged across m rows and n columns. That is, in the display unit 105, n in the X direction, m in the Y direction, and n×m light-emitting pixels P in total are arranged in a matrix. Dummy pixels DP are arranged so as to surround a rectangular region in which the plurality of light-emitting pixels P are arranged. In addition, a cathode contact portion 108 as a second electrode contact portion is arranged so as to surround the dummy pixels DP. That is, the dummy pixels DP are arranged between the cathode contact portion 108 and the rectangular region in which the plurality of light-emitting pixels P are arranged.

In the present exemplary embodiment, the dummy pixels DP and the cathode contact portion 108 are configured to imitate the structure of the light-emitting pixels P. In other words, by surrounding the rectangular region in which the plurality of light-emitting pixels P are arranged, each dummy pixel DP and each cathode contact portion 108 having a size corresponding to one of the light-emitting pixels P is arranged. Note that, the number of dummy pixels DP and cathode contact portions 108 is not limited to this.

The light-shielding portion 124 is arranged to define a circular light-emitting region E1 with respect to the display unit 105. The outline of the boundary BL between the light-emitting region E1 and the light-shielding region E2 is circular. The light-emitting pixels P contributing to display are arranged in the light-emitting region E1. The light-emitting pixels P are also arranged in the light-shielding region E2, but the light-shielding portion 124 is arranged to overlap the light-emitting pixels P. Thus, the light-emitting pixels P that do not contribute to display are arranged in the light-shielding region E2. Hereinafter, the light-emitting pixels P that do not contribute to display will be referred to as light-shielding pixels PS (in FIG. 6, the light-shielding pixels PS are simply denoted as "S"). That is, the light-emitting pixels P, the light-shielding pixels PS, the dummy pixels DP, and the cathode contact portions 108 are arranged in the display unit 105. At an outer edge of the light-emitting region E1, the light-emitting pixels P contributing to display overlap the light-shielding portion 124. Note that, although the arrangement of the light-shielding portion 124 depends on a relationship between the size of the light-emitting region E1 and arrangement pitches of the light-emitting pixels P in the X direction and the Y direction, the light-shielding portion 124 at the outer edge of the light-emitting region E1 is not limited to overlapping with the light-emitting pixels P of one color, and may overlap with the light-emitting pixels P of two or three colors. Detailed configurations and structures of the light-emitting pixels P, the light-shielding pixels PS, the dummy pixels DP, and the cathode contact portions 108 will be described later.

Light-Emitting Pixels and Color Filters

Figure 7:
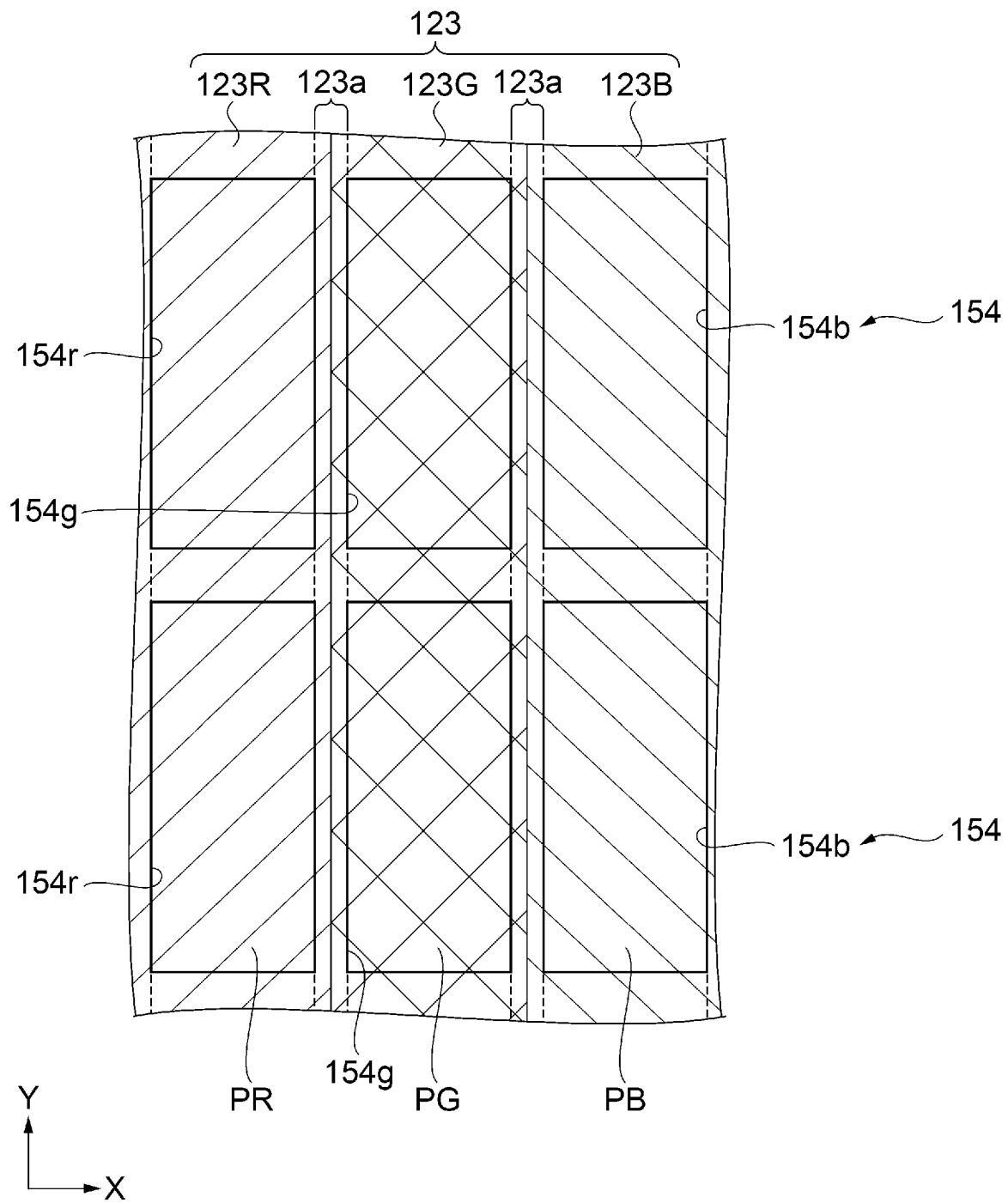
FIG. 7 is a schematic plan view illustrating an arrangement of the color filter in the light-emitting pixel of the first exemplary embodiment.

Next, a relationship between the light-emitting pixel P and the color filter will be described with reference to FIG. 7. FIG. 7 is a schematic plan view illustrating an arrangement of color filters in the light-emitting pixel of the first exemplary embodiment. The light-emitting device 100 of the present exemplary embodiment achieves color display by including the color filter 123 and the light-emitting element 150 obtained white light emission in the light-emitting pixels P. Note that, the color filter 123 is arranged corresponding to the light-emitting pixels P that is in the light-emitting region E1 of the element portion 121 as illustrated in FIG. 2.

As illustrated in FIG. 7, colored layers that are selected from three colors: red (R), green (G), and blue (B), are arranged in the light-emitting pixels P aligned in the X direction and the Y direction. Specifically, the color filter 123 of the present exemplary embodiment is configured to include three color colored layers 123R, 123G, and 123B in a striped form. Each of the three colored layers 123R, 123G, and 123B is arranged extending in the Y direction corresponding to the light-emitting pixels P aligned in the Y direction. Hereinafter, the light-emitting pixel P in which the red colored layer 123R is arranged may be referred to as a light-emitting pixel PR, the light-emitting pixel P in which the green colored layer 123G is arranged may be referred to as a light-emitting pixel PG, and the light-emitting pixel P in which the blue colored layer 123B is arranged may be referred to as a light-emitting pixel PB.

The light-emitting pixels P of the same color adjacent in the Y direction are electrically insulated by the insulating film 154 and the light-emitting pixels P of different colors adjacent in the X direction are electrically insulated by the insulating film 154. A pixel emission region, that is, a pixel emission area of each of the light-emitting pixels PR, PG, and PB is defined by opening parts 154r, 154g, and 154b disposed in the insulating film 154. The opening parts 154r, 154g, and 154b in the present exemplary embodiment are rectangles that are long in the Y direction. In the present exemplary embodiment, the opening 154r, 154g, and 154b is formed so that the pixel emission area of each of the light-emitting pixels PR, PG, and PB is the same, but is not limited to this, the opening parts 154r, 154g, and 154b may have different size or shape for each color in consideration of hue balance in the display.

The boundary between the colored layer 123R and the colored layer 123G is located between the opening 154r and the opening 154g adjacent in the X direction. The boundary between the colored layer 123G and the colored layer 123B is located between the opening 154g and the opening 154b adjacent in the X direction. Similarly, the boundary between the colored layer 123B and the colored layer 123R is located between the opening 154b and the opening 154r adjacent in the X direction.

The color filter 123 is configured to include a light-transmissive CF partition wall 123a disposed at a position overlapping an end part in the X direction of each of the colored layers 123R, 123G, and 123B extending in a stripe shape in the Y direction. Next, a detailed structure of the light-emitting pixel P including the color filter 123 in the light emission panel 110 will be described.

Structure of Light-Emitting Panel

Figure 8:
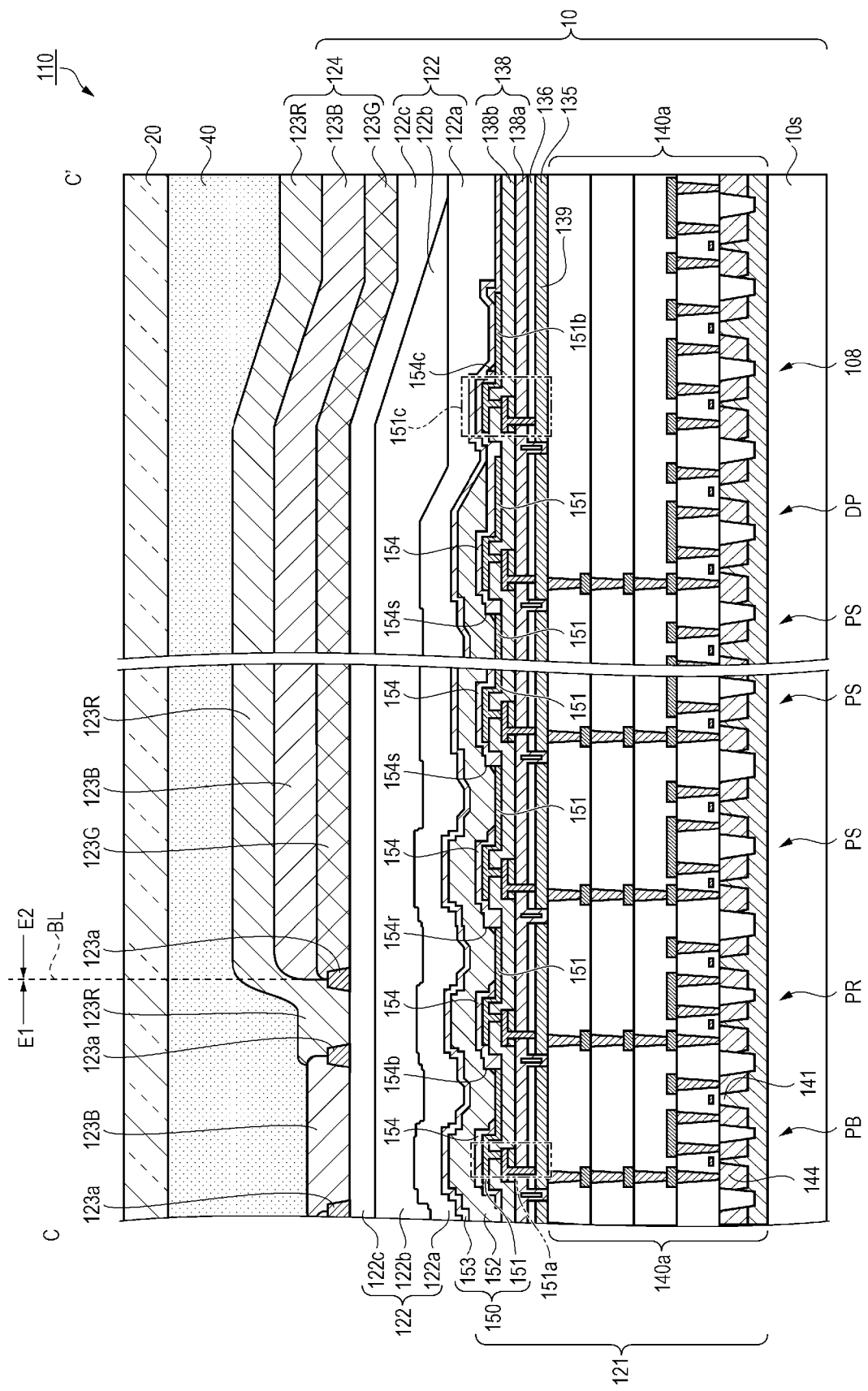
FIG. 8 is a schematic cross-sectional view illustrating a structure of a light-emitting panel of the first exemplary embodiment, cutting along line C-C' of FIG. 5.

A structure of the light-emitting panel 110 of the light-emitting device 100 will be described with reference to FIG. 8. FIG. 8 is a schematic cross-sectional view cut along line C-C' of FIG. 6, illustrating the structure of the light-emitting panel of the first exemplary embodiment. In this case, the line C-C' is a line segment crossing the light-emitting pixels P arranged in the X direction in an order of G, B, and R, the plurality of light-shielding pixels PS, the dummy pixels DP, and the cathode contact portion 108. In FIG. 8, a part of the plurality of light-shielding pixels PS is omitted.

As illustrated in FIG. 8, the light-emitting panel 110 includes the element substrate 10 and the light-transmissive counter substrate 20 that are attached via the light-transmissive filler 40. As described above, a semiconductor substrate such as a silicon substrate is used as a base material 10s of the element substrate 10. The light-emitting element 150 and a circuit portion 140a including various types of transistors and storage capacitors configure the pixel circuit 140 of the light-emitting pixel P. Note that, in FIG. 8, the first transistor 141 and the fourth transistor 144 are illustrated, and other transistors and storage capacitors are omitted.

The light-emitting element 150 includes the anode 151 as the first electrode, the cathode 153 as the second electrode, and a light-emitting function layer 152 interposed between these electrodes. The anode 151 is a light-transmissive electrode, such as Indium Tin Oxide (ITO), and is formed electrically independent of each light-emitting pixels PR, PG, and PB, the light-shielding pixels PS, and the dummy pixels DP.

The light-emitting function layer 152 includes an organic light-emitting layer from which white light is obtained, and is formed across the light-emitting pixels PR, PG, and PB of different colors, the light-shielding pixels PS and the dummy pixels DP. Note that, the configuration of the light-emitting function layer 152 is not particularly limited, but white light can be obtained by combining organic light-emitting layers capable of emitting red (R), green (G), and blue (B) light. Further, a pseudo-white light can be also obtained by combining organic light-emitting layers capable of emitting blue (B) and yellow (Y) light. Further, in addition to the organic light-emitting layer, the light-emitting function layer 152 is configured to include a hole injecting transportation layer disposed on the anode 151 side for efficiently injecting and transporting holes into the organic light-emitting layer, an electron injecting transportation layer disposed on the cathode 153 side for efficiently injecting and transporting electrons to the organic light-emitting layer, and the like.

The cathode 153 is formed from, for example, an alloy of Ag (silver) and Mg (magnesium), which is formed so as to have both light-transmissive and light reflective properties, and is formed across the light-emitting pixels PR, PG, and PB of different colors, the light-shielding pixels PS, the dummy pixels DP and the cathode contact portion 108.

In the red (R) light-emitting pixel PR, an insulating film 154 is formed so that the opening part 154r opens on the anode electrode 151. In the green (G) light-emitting pixel PG, an insulating film 154 is formed so that the opening part 154g opens on the anode electrode 151. In the blue (B) light-emitting pixel PB, an insulating film 154 is formed so that the opening part 154b opens on the anode electrode 151. In the light-shielding pixel PS, an insulating film 154 is formed so that an opening part 154s opens on the anode electrode 151. On the other hand, in the dummy pixel DP, an insulating film 154 is formed so as to cover the anode electrode 151. Accordingly, the light-emitting element 150 included in the dummy pixel DP is configured so that no current flows, thus the dummy pixels DP are always in a non-emitting state.

An electrode 151b formed by using a light-transmissive conductive film is also arranged in the cathode contact portion 108 formed to imitate the structure of the light-emitting pixel P in the same layer as the anode 151 of the light-emitting element 150. Further, an insulating film 154 is formed so that an opening part 154c opens on the electrode 151b. In addition, the cathode 153, which is a common electrode, is formed so as to straddle the cathode contact portion 108. An outer edge of the light-emitting function layer 152 is located between the dummy pixel DP and the cathode contact portion 108. That is, the light-emitting function layer 152 is not formed in the cathode contact portion 108, thus, the electrode 151b and the cathode 153 are shorted at the opening part 154c of the cathode contact portion 108. Note that, as illustrated in FIG. 6, the width in the X direction of the cathode contact portion 108 corresponds to one of the light-emitting pixels P, but the width is not limited to this, and may be, for example, a size corresponding to two of the light-emitting pixels P.

A reflective layer 135, a first insulating film 136, an optical adjusting layer 138, and the like are formed between the anode 151 of each of the light-emitting pixels PR, PG, and PB, the light-shielding pixels PS and the dummy pixels DP, the electrode 151b of the cathode circuit portion 108, and the circuit portion 140a on which the transistor or the like of the pixel circuit 140 is formed. The reflective layer 135, the first insulating film 136, the optical adjusting layer 138, and the like structure a light resonance structure. A detailed configuration of the light resonance structure will be described later, but the reflective layer 135 is formed electrically independent for each of the light-emitting pixels PR, PG, and PB, the light-shielding pixels PS and the dummy pixels DP. The anode electrode 151 included in the light-emitting pixels PR, PG, and PB, the light-shielding pixels PS and the dummy pixels DP is coupled to the fourth transistor 144 of the circuit portion 140a via an anode circuit portion 151a that penetrates the optical adjusting layer 138 and the first insulating film 136 to the reflective layer 135. That is, the reflective layer 135 of the light-emitting pixels PR, PG, and PB, the light-shielding pixels PS and the dummy pixels DP is formed to function as a relay layer for electrical connection between the anode electrode 151 and the fourth transistor 144.

The electrode 151b included in the cathode circuit portion 108 is also coupled to the reflective layer 135 via a contact portion 151c that penetrates the optical adjusting layer 138 and the first insulating film 136. The reflective layer 135 in this case is formed so as to function as a part of the cathode wiring 139 (see FIG. 4) to which the cathode potential VCT is supplied.

A sealing film 122 is formed so as to cover the element portion 121 including the circuit portion 140a and the light-emitting element 150 of the pixel circuit 140, the dummy pixels DP, and the cathode circuit portion 108. The sealing film 122 is configured to include a first sealing film 122a made of an inorganic film formed at least across the display unit 105, an intermediate sealing film 122b made of an organic film formed to alleviate irregularities in the surface of the first sealing film 122a, and a second sealing film 122c made of an inorganic film formed to cover the intermediate sealing film 122b. The intermediate sealing film 122b is formed so as to overlap the light-emitting pixels PR, PG, and PB, the light-shielding pixels PS, the dummy pixels DP, and the cathode circuit portion 108 in a plan view. That is, an outer edge of the intermediate sealing film 122b is located more to the outside than the cathode circuit portion 108. The first sealing film 122a and the second sealing film 122c made of the inorganic film are stacked further outside than the outer edge of the intermediate sealing film 122b. In order to prevent moisture, oxygen or the like from entering into the light-emitting element 150 and deactivating the light-emitting function layer 152, the inorganic film is formed by a vapor deposition method or the like, for example, using an oxynitride film (SiON film) of silicon or the like. The film thickness of the first sealing film 122a configured by the inorganic film is 400 nm, for example, and the film thickness of the second sealing film 122c is 800 nm, for example. The organic film is formed by a printing method or the like, for example, using an epoxy-based resin with excellent translucency. The film thickness of the intermediate sealing film 122b is 2.6 µm, for example.

In forming the colored layers 123R, 123G, and 123B of the color filter 123 in stripe form on the sealing film 122 in which the surface is in a flat state, a light-transmissive CF partition wall 123a is first formed. The CF partition wall 123a is formed in a stripe shape between light-emitting pixels P of different colors that are adjacent to each other in a plan view by coating a photosensitive resin that does not include a color material for the color filter 123 to form a photosensitive resin layer having a predetermined film thickness, and exposing, developing, and post-baking the photosensitive resin layer. The height (film thickness) of the CF partition wall 123a on the sealing film 122 is less than the thickness of the colored layers 123R, 123G, and 123B formed late. In other words, the colored layers 123R, 123G, and 123B are formed so as to cover the CF partition wall 123a.

The colored layers 123R, 123G, and 123B are formed in a striped shape by coating a photosensitive resin that includes the color material of a corresponding color to form a photosensitive resin layer having a predetermined film thickness, and exposing, developing, and post-baking the photosensitive resin layer. As a method for coating the photosensitive resin including a color material, a spin coating method is used, for example, by forming the CF partition wall 123a in advance, a structure is formed in which the predetermined film thickness is easily secured in the colored layers 123R, 123G, and 123B. In the present exemplary embodiment, the green (G) colored layer 123G, the blue (B) colored layer 123B, and the red (R) colored layer 123R are formed in this order. The film thickness of each of the colored layers 123R, 123G, and 123B is not necessarily the same, and is set in consideration of the transmittance of color light and color purity being displayed. In the present exemplary embodiment, the average film thickness of the green (G) colored layer 123G is approximately 1.0 µm, the average film thickness of the blue (B) colored layer 123B is approximately 1.3 µm, and the average film thickness of the red (R) colored layer 123R is set to approximately 1.6 mµm. That is, the colored layers are formed in ascending order of the film thickness.

In the present exemplary embodiment, the green (G) colored layer 123G, the blue (B) colored layer 123B, and the red (R) colored layer 123R are stacked in this order to form the light-shielding portion 124. In the light-shielding region E2 surrounding the light-emitting region E1, the light-shielding portion 124 is formed by overlaying the colored layers 123G, 123B, and 123R of a plurality of colors, and light that leaks in an oblique direction from the light-emitting pixels P in the light-emitting region E1 is shielded by the light-shielding portion 124. Specifically, a CF partition wall 123a is arranged on the sealing film 122 at the outer edge of the light-emitting region E1. That is, the CF partition wall 123a is formed at the outer edge of the light-emitting region E1 so as to be circular in a plan view. In this case, the boundary BL between the light-emitting region E1 and the light-shielding portion 124 is located on the red (R) light-emitting pixel PR. The CF partition wall 123a is arranged on the sealing film 122 in the red (R) light-emitting pixel PR located at the outer edge of the light-emitting region E1, and the light-shielding portion 124 is formed by overlaying the colored layers 123G, 123B, and 123R of the plurality of colors outside the CF partition wall 123a.

The filler 40 is coated so as to cover the color filter 123, and the light-transmissive counter substrate 20 is adhered to the filler 40 and cured. The filler 40 is, for example, a thermosetting epoxy resin with a film thickness of approximately 2.0 µm.

Light Resonance Structure

Figure 9:
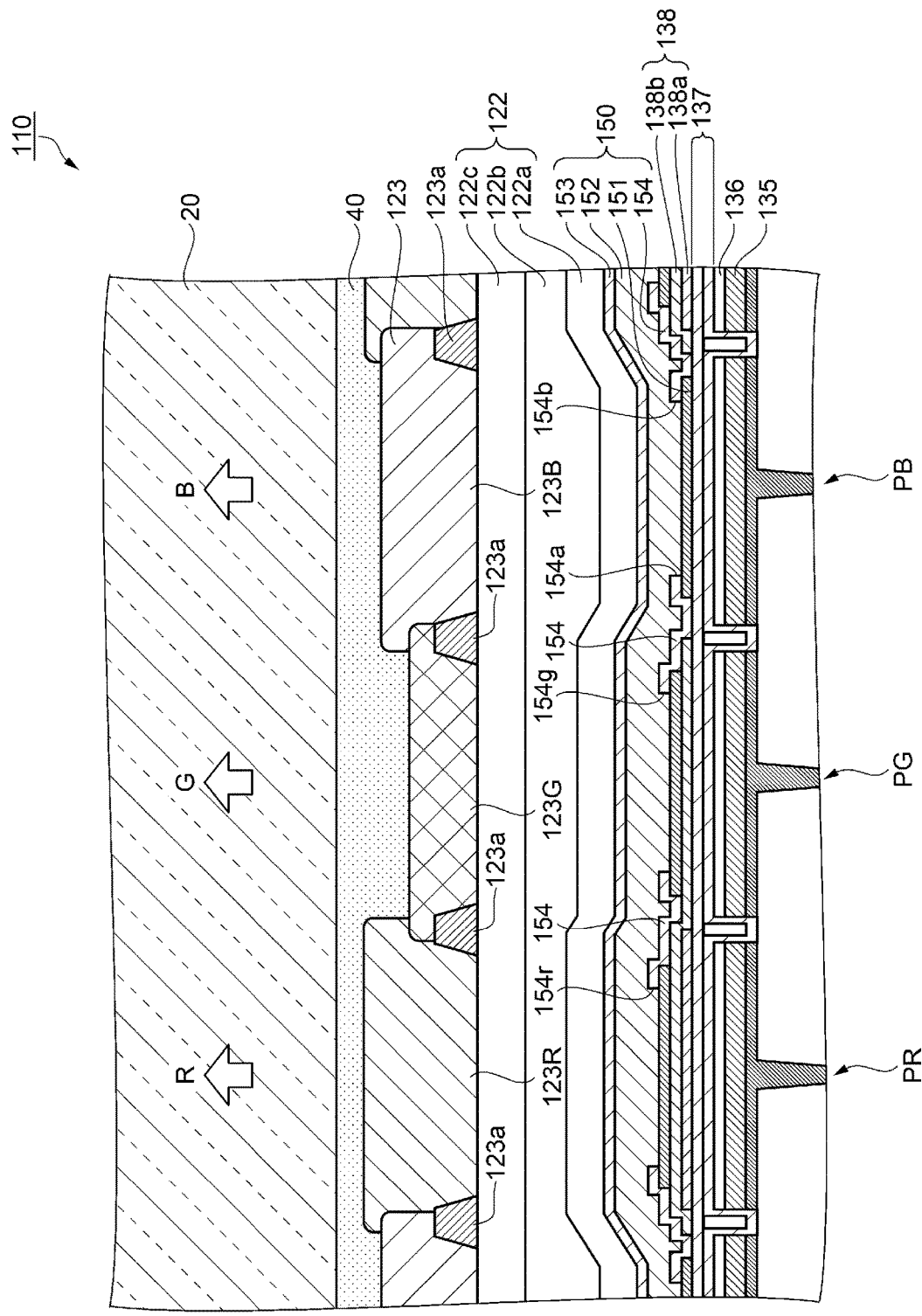
FIG. 9 is an enlarged cross-sectional view illustrating a light resonance structure of a light-emitting pixel of the light-emitting panel of the first exemplary embodiment.

Next, the light resonance structure of the light-emitting panel 110 will be described with reference to FIG. 9. FIG. 9 is an enlarged cross-sectional view illustrating the light resonance structure of the light-emitting pixels of the light-emitting panel of the first exemplary embodiment.

As described above, the light-emitting panel 110 of the light-emitting device 100 of the present exemplary embodiment is configured to transmit the white light from the light-emitting element 150 through the colored layers 123R, 123G, and 123B of the color filter 123, and extract the color light of any of red (R), green (G), and blue (B) from the light-emitting pixel P. In addition, from the viewpoint of improving the color purity of the color light, a light resonance structure corresponding to the wavelength of the color light is incorporated in the light-emitting pixel P.

FIG. 9 illustrates the respective light resonance structures of light-emitting pixels PR for which light emission of red (R) light is obtained, light-emitting pixels PG for which emission of green (G) light is obtained, and light-emitting pixels PB for which emission of blue (B) light is obtained. As illustrated in FIG. 9, the reflective layer 135 is arranged in a lower layer of the transparent anode 151 of each of the light-emitting pixels PR, PG, and PB. Additionally, the cathode 153 is configured so as to combine light transmissive and light reflective properties. Therefore, a light that is emitted from the light-emitting function layer 152 between the anode 151 and the cathode 153 and transmitted through the cathode 153, and that is incident on each of the colored layers 123R, 123G, and 123B of the color filter 123, includes a light transmitted through the anode 151 and reflected by the reflective layer 135, and a light multiply reflected between the reflective layer 135 and the cathode 153.

In the light-emitting pixels PR, PG, and PB, by varying an optical distance between the reflective layer 135 and the cathode 153, a light resonance is generated between the reflective layer 135 and the cathode 153, and the intensity of light having a specific wavelength is improved in accordance with the color light. The resonant wavelength A as the specific wavelength obtained by light resonance is guided by the following Expression 1:

$$m\lambda = 2nd + \Phi \quad (1)$$

In Expression 1, m is a dimension of the light resonance with a positive integer (0, 1, 2, . . . ), n indicating a refractive index of an optical layer between the reflective layer 135 and the cathode 153, d is the film thickness of the optical layer, and @ is a reflection phase shift. In practice, since there are a plurality of layers between the reflective layer 135 and the cathode 153, the sum of the product of the refractive index and the film thickness of each layer is applied to determine the value of mλ.

Further, in the light-emitting pixels PR, PG, and PB, the film thickness of the anode electrode 151 is equivalent, and the film thickness of the light-emitting function layer 152 between the anode 151 and the cathode 153 is also equivalent. In the present exemplary embodiment, by varying the optical distance between the anode electrode 151 and the reflective layer 135 in the light-emitting pixels PR, PG, and PB, a light resonance corresponding to m=1 in Expression 1 described above is caused. Note that, even in the sealing film 122 and the color filter 123 on the cathode 153, a reflection is slightly generated at mutual interfaces. The dimensions of the light resonance due to these reflections correspond to m=5 to 10, but considering the refractive index and the film thickness of the optical layer configuring the sealing film 122 and the color filter 123, the light resonance due to these reflections can be substantially ignored.

Specifically, in the light-emitting pixel PR, a first insulating film 136 that covers the reflective layer 135 and functions as a planarization layer, a second insulating film 137 that covers the first insulating film 136 and for electrically independently partitioning the reflective layer 135, a first optical adjusting layer 138a, and a second optical adjusting layer 138b are formed between the reflective layer 135 and the anode 151. The reflective layer 135 is made of, for example, aluminum (Al) which is a light reflective metal, or an alloy including Al. The first insulating film 136 is, for example, a silicon oxide film ($SiO_2$ film) having a refractive index of 1.46 and a film thickness of 35 nm, for example. The second insulating film 137 is, for example, a silicon nitride film (SiN film) having a refractive index of 1.8 and a film thickness of 50 nm, for example. The first optical adjusting layer 138a and the second optical adjusting layer 138b are, for example, a silicon oxide film ($SiO_2$ film) having a refractive index of 1.46 and a film thickness of 50 nm, respectively, for example. The first optical adjusting layer 138a and the second optical adjusting layer 138b may be collectively and simply referred to as an optical adjusting layer 138. Accordingly, the refractive index of the optical adjusting layer 138 is 1.46 and the film thickness is 100 nm. The anode 151 is formed, for example, using an ITO film with a refractive index of 1.7 to 1.8, such that the film thickness is 20 nm, for example. The light-emitting function layer 152 includes an organic light-emitting layer or the like as described above, but in the present exemplary embodiment, the refractive index is 1.7 to 1.8 and the film thickness is 100 nm, for example. The cathode 153 is, for example, an alloy including silver (Ag) and magnesium (Mg), and a film is formed so that the film thickness is 20 nm, for example, so as to have light transmissive and light reflective properties. According to the light resonance structure of the light-emitting pixel PR, resonant light having a resonance wavelength A of approximately 610 nm with improved light intensity due to light resonance is obtained. The red (R) color light with improved color purity is obtained from the light-emitting pixel PR by transmitting such a resonance light through the colored layer 123R.

In the light-emitting pixel PG, a first insulating film 136, a second insulating film 137, and a second optical adjusting layer 138b are formed between the reflective layer 135 and the anode 151. In other words, compared to the light-emitting pixel PR, in the light-emission pixel PG, the optical distance between the reflective layer 135 and the cathode 153 is correspondingly reduced by an amount that the first optical adjusting layer 138a is not formed. According to the light resonance structure of the light-emitting pixel PG, resonant light having a resonance wavelength A of approximately 540 nm with improved light intensity due to light resonance is obtained. The green (G) color light with improved color purity is obtained from the light-emitting pixels PG by transmitting the colored layer 123G with such a resonance light.

In the light-emitting pixel PB, a first insulating film 136 and a second insulating film 137 are formed between the reflective layer 135 and the anode 151. In other words, compared to the light-emitting pixel PR, in the light-emitting pixel PB, the optical distance between the reflective layer 135 and the cathode 153 is correspondingly reduced by an amount that the optical adjusting layer 138 is not formed. According to the light resonance structure of the light-emitting pixel PB, resonant light having a resonance wavelength A of approximately 470 nm with improved light intensity due to light resonance is obtained. The blue (B) color light with improved color purity is obtained from the light-emitting pixel PB by transmitting the colored layer 123B with the resonant light.

According to the light-emitting device 100 of the first exemplary embodiment, the following effects can be achieved.

(1) The light-emitting panel 110 of the light-emitting device 100 includes a display unit 105 in which rectangular light-emitting pixels P are arranged, and a light-blocking unit 124 that defines the light-emitting region E1 of the display 105 and shields a region other than the light-emitting region E1 of the display 105 from light to travel, and the boundary BL between the light-emitting region E1 and the light-blocking unit 124 is circular. Therefore, even when the shape of the light-emitting pixels P is rectangular, the outline of the light-emitting region E1 may not have a stepped shape, and the outline of the light-emitting region E1 can be formed into a smooth circle. Further, the size of the light-emitting pixels P overlapping with the light-blocking unit 124 at the outer edge of the light-emitting region E1 is the same as the size of the light-emitting pixels P arranged in the light-emitting region E1. Therefore, the current value regarding light emission of the light-emitting pixels P overlapping the light-blocking unit 124 at the outer edge of the light-emitting region E1 is at the same level as the current value regarding the light emission of the light-emitting pixels P in the light-emitting region E1. Thus, the light-emitting device 100 in which luminance unevenness, that is, display unevenness is unlikely to occur on the outer edge side of the light-emitting region E1, can be provided. In other words, as a drive transistor of the light-emitting pixels P overlapping the light-blocking unit 124 at the outer edge of the light-emitting region E1, a drive transistor equivalent to the driving transistor of the light-emitting pixels P in the light-emitting region E1 can be used, and the pixel circuits 140 of these light-emitting pixels P can be similarly controlled without preparing special data signals and the like.

(2) The light-emitting pixel P in the light-emitting region E1 includes a light-emitting element 150 and colored layers that are selected from red (R), green (G), and blue (B) and arranged on the sealing film 122 covering the light-emitting element 150 and the light-blocking unit 124 is formed by laminating colored layers 123G, 123B, and 123R of a plurality of colors on the sealing film 122. Therefore, a full-color display can be achieved in the light-emitting region E1, and the light-blocking unit 124 is configured using the three-color colored layers 123G, 123B, and 123R, and thus a step of newly forming the light-blocking unit 124 is unnecessary. In addition, by disposing the light-blocking unit 124 on the sealing film 122, the light-blocking unit 124 can be arranged adjacent to the light-emitting element 150. Accordingly, light that leaks to the outside of the light-emitting region E1 in an oblique direction with respect to the normal direction from the light-emitting pixels P located at the outer edge of the light-emitting region E1 can be reliably blocked by the light-blocking unit 124. Thus, a light-emitting device 100 capable of color display with good appearance in the light-emitting region E1 can be provided.

(3) The cathode circuit portion 108 is formed to imitate the structure of the light-emitting element 150 in the light-emitting pixels P, and the cathode circuit portion 108 includes an electrode 151b formed in the same layer as the anode 151 of the light-emitting element 150. The electrode 151b is coupled to the cathode 153 at the opening part 154c of the insulating film 154 formed on the electrode 151b. Further, the electrode 151b is coupled to the cathode wiring 139 of the circuit unit 140a via the circuit portion 151c. The cathode electrode potential VCT is applied to cathode wiring 139. Therefore, when forming the anode 151, the electrode 151b that configures the cathode contact unit 108 can be formed, thus the manufacturing process is not complicated, and the light-emitting device 100 having a simple configuration can be provided.

(4) The display unit 105 includes dummy pixels DP between the cathode contact portion 108 and a region in which a plurality of light-emitting pixels P and light-blocking pixels PS are arranged. The light-emitting function layer 152 is formed across the dummy pixels DP and the region in which the plurality of light-emitting pixels P and light-blocking pixels PS are arranged. The outer edge of the light-emitting function layer 152 is located between the dummy pixels DP and the cathode contact portion 108. Thus, when forming the light-emitting function layer 152, for example, even the film thickness of the outer edge side of the light-emitting function layer 152 varies, such variation in film thickness can be prevented from affecting the light-emitting pixels P. That is, the film thickness of the light-emitting function layer 152 can be achieved to be uniform in the region in which the plurality of light-emitting pixels P and light-blocking pixels PS are arranged, thus the luminance unevenness in the light-emitting pixels P due to variations in the film thickness of the light-emitting function layer 152 can be further reduced. In addition, the anode electrode 151 of the light-emitting element 150 in the dummy pixel DP is covered by the insulating film 154, thus, the anode 151 and the light-emitting function layer 152 are isolated and non-emitting. That is, the configuration is such that light emission is not generated unexpectedly in the light-blocking region E2.

Second Exemplary Embodiment

Other Light-Emitting Devices

Figure 10:
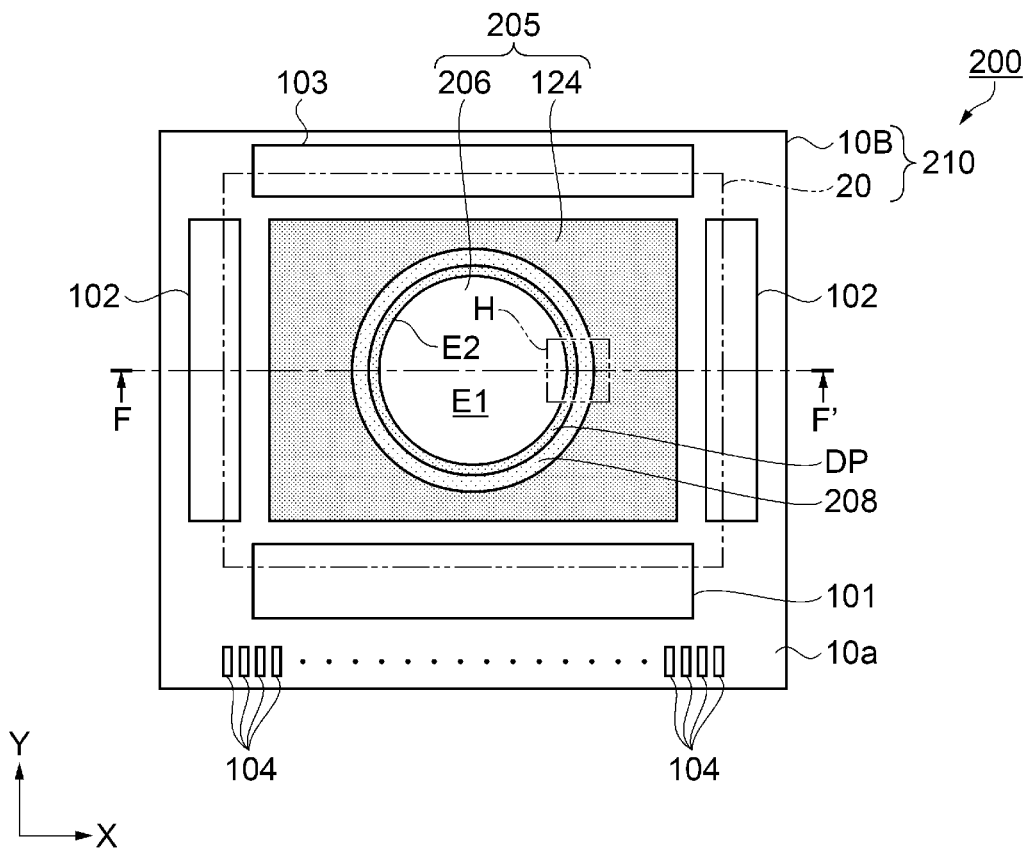
FIG. 10 is a schematic plan view illustrating a configuration of a light-emitting device according to a second exemplary embodiment.
Figure 11:
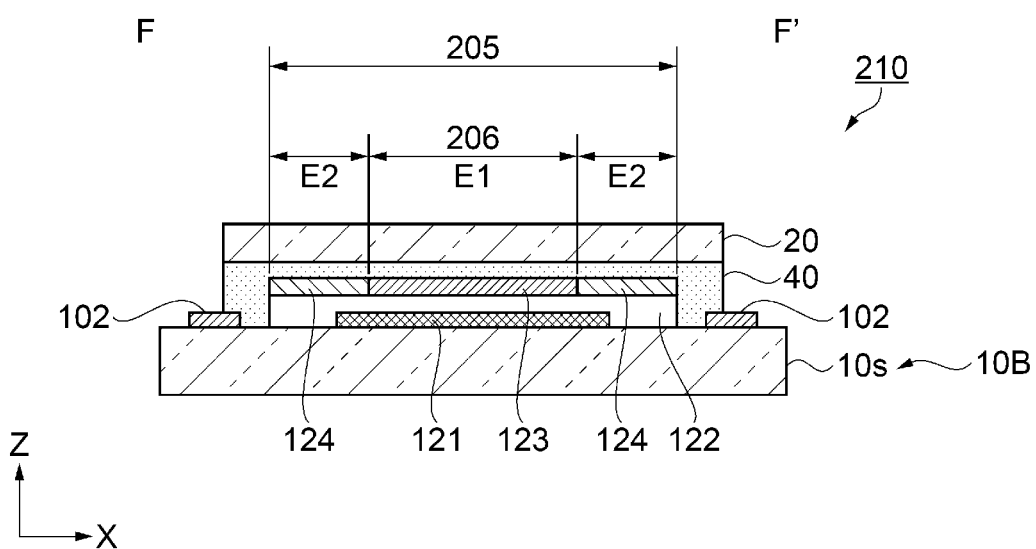
FIG. 11 is a schematic cross-sectional view illustrating a structure of a light-emitting device according to the second exemplary embodiment.

Next, a basic configuration of a light-emitting device according to a second exemplary embodiment will be described with reference to FIG. 10 and FIG. 11. FIG. 10 is a schematic plan view illustrating a configuration of the light-emitting device of the second exemplary embodiment. FIG. 11 is a schematic cross-sectional view illustrating a structure of the light-emitting device of the second exemplary embodiment. Note that the line F-F' illustrated in FIG. 10 is a line segment crossing the center of a light-emitting unit 206 of the light-emitting device 200. The light-emitting device 200 of the second exemplary embodiment differs from the light-emitting device 100 of the first exemplary embodiment in the arrangement of the light-emitting pixels P, the dummy pixels DP, and the cathode contact portion 108 as the second electrode contact portion in the display unit. Further, the electrical configuration including the pixel circuit of the light-emitting device 200 of the second exemplary embodiment, the arrangement of the color filters 123 in the light-emitting pixels P, and the light resonance structure are the same as the light-emitting device 100 described above. Accordingly, the same configurations as the configurations in the light-emitting device 100 of the first exemplary embodiment are denoted by the same reference signs, and detailed description of the same configurations will be omitted.

As illustrated in FIG. 10, the light-emitting device 200 of the present exemplary embodiment includes a light-emitting panel 210 including an element substrate 10B and a counter substrate 20 that is light-transmissive and is arranged opposite the element substrate 10B. A display unit 205 including a light-emitting unit 206 and a light-blocking unit 124 surrounding the light-emitting unit 206 is disposed in the element substrate 10B. A detailed configuration of the display unit 205 is described later, but rectangular light-emitting pixels P are arranged in the light-emitting unit 206. The light-emitting pixel P includes a light-emitting element 150, a data line driving circuit 101 and a scanning line driving circuit 102, which serve as a driving circuit for driving the light-emitting elements 150, and an inspecting circuit 103 are disposed in the periphery of the display unit 205. The light-emitting device 200 is also an active drive type in which the light-emitting elements 150 disposed in the light-emitting pixels P can be individually driven.

A plurality of external connection terminals 104 are disposed on a terminal part 10a of the element substrate 10B to couple with an external driving circuit. Various signals and power supply potentials are supplied from the external driving circuit via the external connection terminals 104 to the data line driving circuit 101 and the scanning line driving circuit 102 to drive the light-emitting panel 210.

In the present exemplary embodiment, a region in which the light-emitting unit 206 is disposed is the light-emitting region E1, and a region in which the light-blocking unit 124 is disposed so as to surround the light-emitting unit 206 is a light-blocking region E2. An outline of the display unit 205 is rectangular (rectangular shape), and an outline of the light-emitting unit 206 (light-emitting region E1) is circular different from a rectangular. The light-emitting unit 206 is disposed substantially at the center of the display unit 205. In the light-blocking region E2, dummy pixels DP, and a cathode contact portion 208 as a second electrode contact portion, are disposed along the outer periphery of the light-emitting unit 206.

As illustrated in FIG. 11, the element substrate 10B and the counter substrate 20 are bonded via a filler 40 made of light-transmissive material, for example, an epoxy-based resin. The filler 40 is arranged so as to cover the display unit 205 and partially overlap on the peripheral circuit including the scanning line driving circuit 102.

An element unit 121 including a plurality of light-emitting elements 150, a sealing film 122 covering the element unit 121, and a color filter 123 arranged on the sealing film 122 corresponding to the light-emitting pixels P, are disposed in the element substrate 10B. Further, a light-blocking unit 124 is disposed on the sealing film 122 in the light-blocking region E2 surrounding the light-emitting unit 206 (light-emitting region E1). In a plan view, the element unit 121 is disposed so as to overlap with the color filter 123, and partially overlap with the light-blocking unit 124. That is, the arrangement of the element unit 121 on a base material 10s is one configuration different from the configuration of the light-emitting device 100 of the first exemplary embodiment. In the light-emitting region E1, light emitted from the light-emitting element 150 is emitted from the counter substrate 20 side through the sealing film 122 and the color filter 123. The display unit 205 includes the element unit 121, the sealing film 122, the color filter 123, and the light-blocking unit 124, and details of these configurations will be described later. Note that, a semiconductor substrate such as a silicon substrate is used as a base material 10s of the element substrate 10B in which the element unit 121 is formed.

In this light-emitting panel 210, driving lines for electrically coupling the data line driving circuit 101 and the scanning line driving circuit 102 as the driving circuit for driving the light-emitting element 150 are disposed in the display unit 205. The driving lines are arranged along a long side in the X direction and along a short side in the Y direction in the rectangular display unit 205. The light-emitting unit 206 is circular and the display unit 205 is rectangular, thus, the shorter the part of the driving line arranged in the X direction or the Y direction in the light-emitting region E1 in which the light-emitting unit 206 is disposed, the longer the part of the driving line arranged in the X direction or the Y direction in the light-blocking region E2 in which the light-blocking unit 124 is disposed becomes.

Configuration of Display Unit

Figure 12:
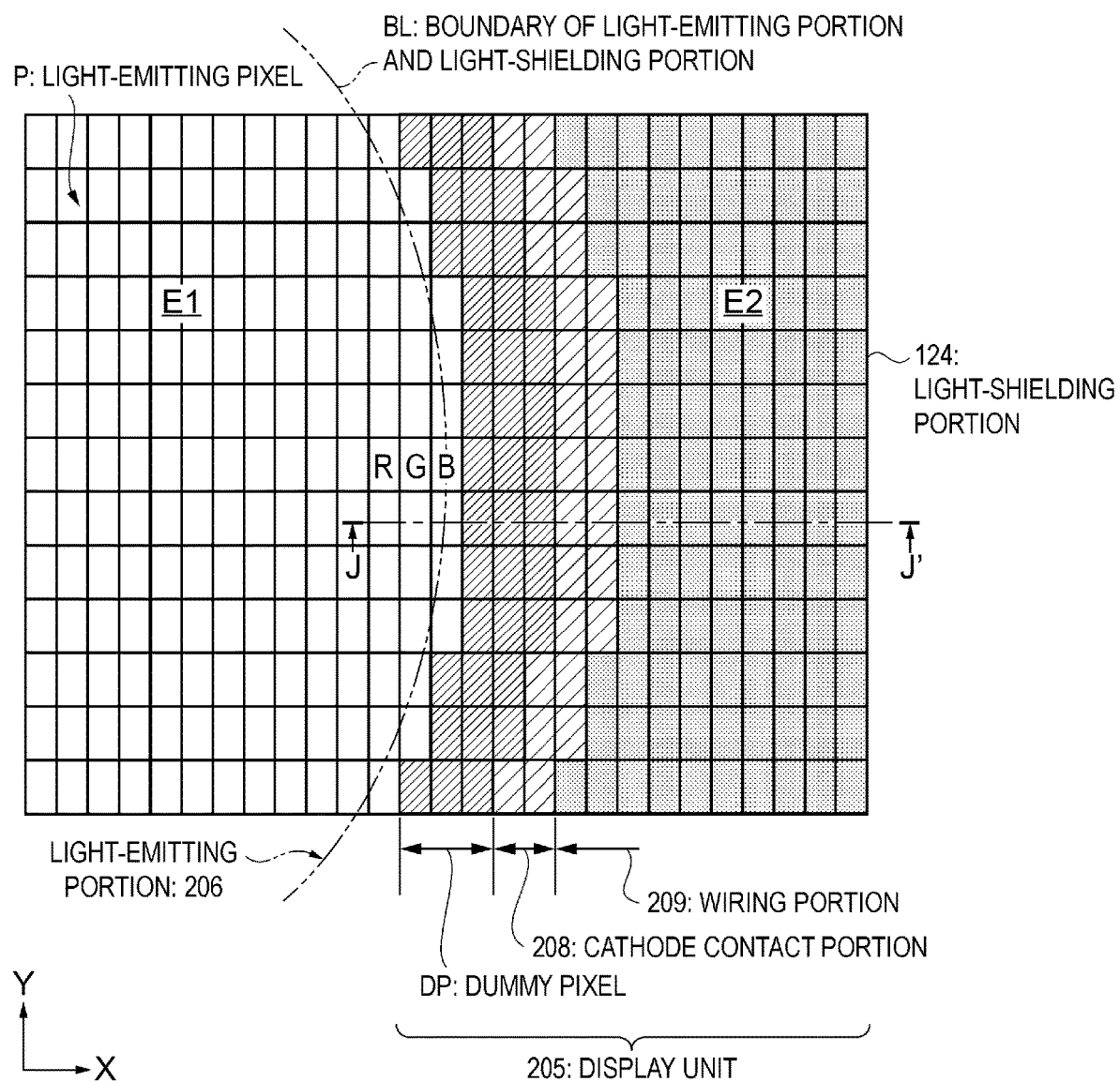
FIG. 12 is a schematic plan view illustrating a configuration of a display unit in the light-emitting device of the second exemplary embodiment.

Next, a configuration of the display unit 205 will be described with reference to FIG. 12. FIG. 12 is a schematic plan view illustrating a configuration of the display unit in the light-emitting device of the second exemplary embodiment. Note that, FIG. 12 is an enlarged plan view of a quadrangular region H surrounded by a two-dot chain line illustrated in the display unit 205 in FIG. 10.

As illustrated in FIG. 12, the display unit 205 is configured to include the light-emitting unit 206 and the light-blocking unit 124. In the light-emitting unit 206, a plurality of light-emitting pixels P having a rectangular shape in which a length of a side part in the Y direction is longer than a length of a side part in the X direction, are aligned in the X direction and the Y direction. When the light-emitting pixels P is expanded to a recognizable state, there is a step due to the shapes of the light-emitting pixels P on the outer periphery of the light-emitting unit 206. On the other hand, the light-emitting pixels P located at the outer edge of the light-emitting unit 206 overlap with the light-blocking unit 124, and the boundary BL between the light-emitting region E1 and the light-blocking region E2 defined by the light-blocking unit 124 has a curved shape. That is, the outline of the light-emitting unit 206 is substantially smooth circular. Some of the light-emitting pixels P located at the outer edge of the light-emitting region E1, dummy pixels DP, a cathode contact portion 208, and a wiring portion 209 are arranged in the light-blocking region E2.

The dummy pixels DP are arranged surrounding the light-emitting unit 206. In addition, the cathode contact portion 208 is arranged outside the dummy pixels DP. That is, the outlines of the dummy pixels DP and the cathode contact portion 208 are also apparently circular. The outside of the cathode contact portion 208 serves as the wiring portion 209 in which wiring is arranged regarding the light-emitting pixels P, the dummy pixels DP, and the cathode contact portion 208.

In the present exemplary embodiment, the dummy pixels DP are, of course, the cathode contact portion 208 adjacent to the dummy pixels DP is also configured to imitate the structure of the light-emitting pixels P. The specific structure of the dummy pixels DP and the cathode contact portion 208 will be described later.

In FIG. 12, the number of the dummy pixels DP arranged on the outer peripheral side of the light-emitting unit 206 is three, but the present disclosure is not limited to this. It is sufficient that at least one dummy pixel DP is arranged along the outer periphery of the light-emitting unit 206. In addition, the cathode contact portion 208 arranged on the outer peripheral side of the dummy pixels DP is two in terms of the planar size of the light-emitting pixel P, but is not limited to this. It is sufficient that the cathode contact portion 208 corresponding to at least one of the light-emitting pixels P is arranged along the outer periphery of the dummy pixels DP. In the present exemplary embodiment, the cathode contact portion 208 is arranged at equal distances with respect to the light-emitting pixels P located at the outer edge of the light-emitting unit 206 so as to sandwich the dummy pixels DP. In other words, the distance from the center of the circular light-emitting unit 206 to the cathode contact portion 208 is equidistant in the X direction and the Y direction.

Although a detailed configuration of the color filter 123 in the light-emitting unit 206 is not illustrated in FIG. 12, in the light-emitting panel 210 of the second exemplary embodiment, similarly to the light-emitting panel 110 of the first exemplary embodiment, the colored layers 123R, 123G, and 123B are disposed in a striped form corresponding to the light-emitting pixels PR, PG, and PB of each color.

Structure of Light-Emitting Panel

Figure 13:
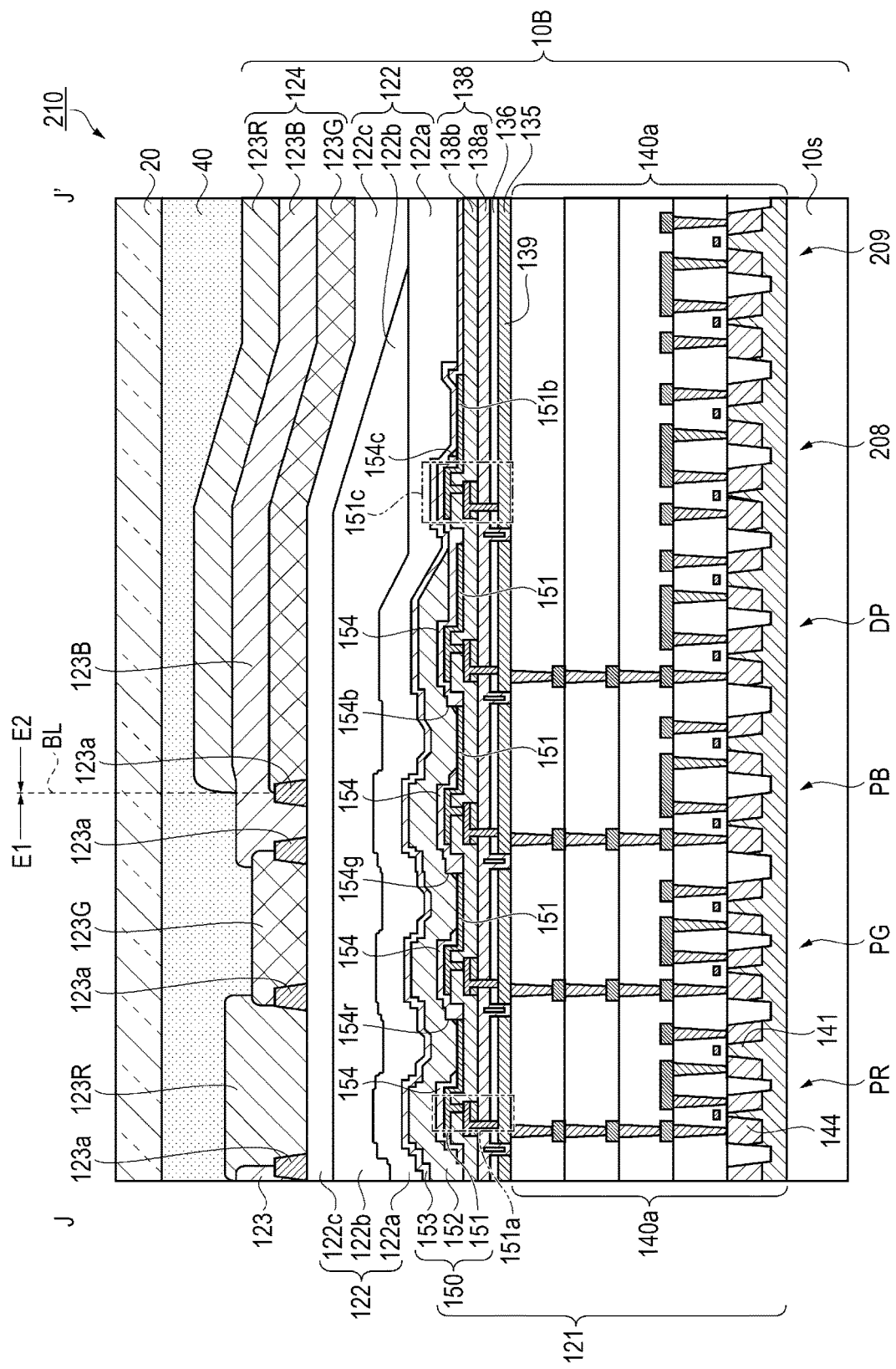
FIG. 13 is a schematic cross-sectional view illustrating a structure of a light-emitting panel in the light-emitting device of the second exemplary embodiment.

Next, a structure of the light-emitting panel 210 of the light-emitting device 200 will be described with reference to FIG. 13. FIG. 13 is a schematic cross-sectional view illustrating the structure of the light-emitting panel in the light-emitting device of the second exemplary embodiment. Note that FIG. 13 is a schematic cross-sectional view cut along line J-J', of part of the display unit 205 illustrated in FIG. 12. In this case, the line J-J' is a line segment crossing the light-emitting pixels P arranged in the order of B, R, G, and B in the X direction, and crossing the dummy pixels DP and the cathode contact portion 208.

As illustrated in FIG. 13, the light-emitting panel 210 includes an element substrate 10B and a light-transmissive counter substrate 20 that are attached via a light-transmissive filler 40. A semiconductor substrate such as a silicon substrate is used as the base material 10s of the element substrate 10B. The light-emitting element 150 and a circuit unit 140a including various types of transistors and storage capacities, which constitute the pixel circuit 140 of the light-emitting pixel P, are formed on the base material 10s. Note that, in FIG. 13, the first transistor 141 and the fourth transistor 144 are illustrated, and other transistors and storage capacitors are omitted.

The anode 151 of the light-emitting element 150 is a transparent electrode, such as ITO (Indium Tin Oxide), and is formed electrically independent of each of the light-emitting pixels PR, PG, and PB and the dummy pixels DP.

The light-emitting function layer 152 includes an organic light-emitting layer from which white light is obtained, and is formed across the light-emitting pixels PR, PG, and PB of different color and dummy pixels DP.

The cathode 153 of the light-emitting element 150 is formed from, for example, an alloy of Ag (silver) and Mg (magnesium), which is formed so as to combine light transmissive and light reflective properties, and is formed across the light-emitting pixels PR, PG, and PB of different colors, the dummy pixels DP, and the cathode contact portion 208.

In the red (R) light-emitting pixel PR, an insulating film 154 is formed so that the opening part 154r opens on the anode 151. In the green (G) light-emitting pixel PG, an insulating film 154 is formed so that the opening part 154g opens on the anode 151. In the blue (B) light-emitting pixel PB, an insulating film 154 is formed so that the opening part 154b opens on the anode 151. On the other hand, in the dummy pixel DP, an insulating film 154 is formed so as to cover the anode 151. Accordingly, the light-emitting element 150 included in the dummy pixel DP is configured so that no current flows, thus the dummy pixels DP are always in a non-emitting state. Note that, as illustrated in FIG. 12, the number of dummy pixels DP adjacent to the light-emitting pixels P is three in the present exemplary embodiment, but one dummy pixel DP is illustrated in FIG. 13 for convenience of explanation.

An electrode 151b formed by using a transparent conductive film is also arranged in the cathode contact portion 208 formed to imitate the structure of the light-emitting element 150 in the light-emitting pixel P in the same layer as the anode 151 of the light-emitting 150. Further, an insulating film 154 is formed so that an opening part 154c opens on the electrode 151b. In addition, the cathode 153, which is a common electrode, is formed so as to straddle the cathode contact portion 208. An outer edge of the light-emitting function layer 152 is located between the dummy pixel DP and the cathode contact portion 208. That is, the light-emitting function layer 152 is not formed in the cathode contact portion 208, thus, it is in a state where the electrode 151b and the cathode 153 are shorted at the opening part 154c of the cathode contact portion 208. Note that, as illustrated in FIG. 12, the width in the X direction of the cathode contact portion 208 corresponds to two of the light-emitting pixels P, but in the present exemplary embodiment, for convenience of explanation, the cathode contact portion 208 is illustrated at a size corresponding to one of the light-emitting pixels P.

A reflective layer 135, a first insulating film 136, an optical adjusting layer 138, and the like are formed between the anode 151 of each of the light-emitting pixels PR, PG, and PB and the dummy pixels DP, the electrode 151b of the cathode contact portion 208, and the circuit unit 140a on which the transistor or the like of the pixel circuit 140 is formed. The reflective layer 135, the first insulating film 136, the optical adjusting layer 138, and the like constitute a light resonance structure. The light resonance structure is the same as the configuration described in the light-emitting panel 110 of the first exemplary embodiment using FIG. 9. Thus, a detailed description of the resonant structure is omitted. The anode 151 included in each of the light-emitting pixels PR, PG, and PB and the dummy pixels DP is coupled to the fourth transistor 144 of the circuit unit 140a via an anode contact portion 151a that penetrates the first insulating film 136 to the reflective layer 135 functioning as a relay layer.

The electrode 151b included in the cathode contact portion 208 is coupled to the reflective layer 135 formed to function as part of the cathode wiring 139 (see FIG. 4) to which the cathode potential VCT is supplied via the contact portion 151c that penetrates the first insulating film 136.

A sealing film 122 is formed so as to cover the element unit 121 including the circuit unit 140a and the light-emitting element 150 of the pixel circuit 140, the dummy pixels DP, and the cathode contact portion 208. The sealing film 122 is configured to include a first sealing film 122a made of an inorganic film formed at least across the display unit 105, an intermediate sealing film 122b made of an organic film formed to alleviate irregularities in the surface of the first sealing film 122a, and a second sealing film 122c made of an inorganic film formed to cover the intermediate sealing film 122b. The intermediate sealing film 122b is formed so as to overlap the light-emitting pixels PR, PG, and PB, the dummy pixel DP, and the cathode contact portion 208 in a plan view. That is, an outer edge of the intermediate sealing film 122b is located outward of the cathode contact portion 208. The first sealing film 122a and the second sealing film 122c made of the inorganic film are stacked outside the outer edge of the intermediate sealing film 122b. The material configuration of such a sealing film 122 is the same as that of the light-emitting panel 110 of the first exemplary embodiment described above, the first sealing film 122a is formed by using, for example, a SiON film, and the film thickness is 400 nm, for example. The second sealing film 122c is also formed by using, for example, a SiON film, and the film thickness is 800 nm, for example. The intermediate sealing film 122b is formed by using, for example, an epoxy-based resin having excellent translucency, and the film thickness is 2.6 µm, for example.

When forming the colored layers 123R, 123G, and 123B of the color filter 123 in stripe form on the sealing film 122 in which the surface is in a flat state, a transparent CF partition wall 123a is first formed. The CF partition wall 123a is formed in a stripe shape between the light-emitting pixels P of different colors that are adjacent to each other in a plan view by coating a photosensitive resin that does not include a color material for the color filter 123 to form a photosensitive resin layer having a predetermined film thickness, exposing and developing, and post-baking the photosensitive resin layer. The height (film thickness) of the CF partition wall 123a on the sealing film 122 is less than the film thickness of the colored layers 123R, 123G, and 123B formed later. In other words, the colored layers 123R, 123G, and 123B is formed so as to cover the CF partition wall 123a.

The colored layers 123R, 123G, and 123B is formed in a striped shape by coating a photosensitive resin that includes a color material of a corresponding color to form a photosensitive resin layer having a predetermined film thickness, exposing and developing, and post-baking the photosensitive resin layer. As a method for coating the photosensitive resin including a color material, a spin coating method is used, for example, by forming the CF partition wall 123a in advance, a structure is formed in which the predetermined film thickness is easily secured in the colored layers 123R, 123G, and 123B. In the present exemplary embodiment, similar to the first exemplary embodiment described above, the green (G) colored layer 123G, the blue (B) colored layer 123B, and the red (R) colored layer 123R are formed in this order. The film thickness of the colored layer 123R, 123G, and 123B is not necessarily the same, and is set in consideration of the transmittance of color light and color purity being displayed. In the present exemplary embodiment, the average film thickness of the green (G) colored layer 123G is approximately 1.0 µm, the average film thickness of the blue (B) colored layer 123B is approximately 1.3 µm, and the average film thickness of the red (R) colored layer 123R is set to approximately 1.6 µm. That is, the colored layers are formed in ascending order of the film thickness.

In the present exemplary embodiment, the green (G) colored layer 123G, the blue (B) colored layer 123B, and the red (R) colored layer 123R are stacked in this order to form a light-blocking unit 124, so as to overlap with the dummy pixels DP and the cathode contact portion 208 in a plan view. Specifically, in this case, the CF partition wall 123a is arranged on the sealing film 122 in the blue (B) light-emitting pixel PB located at the outer edge of the light-emitting unit 206, and the colored layers 123G, the colored layer 123B, and the colored layer 123R of three colors are stacked outside the CF partition wall 123a to configure the light-blocking unit 124. That is, the boundary BL between the light-emitting unit 206 and the light-blocking unit 124 is located on the blue (B) light-emitting pixel PB. In addition, the CF partition wall 123a located at the boundary BL between the light-emitting unit 206 and the light-blocking unit 124 is circular in a plan view.

The filler 40 is coated so as to cover the color filter 123, and the light-transmissive counter substrate 20 is adhered to cure the filler 40. The filler 40 is, for example, a thermosetting epoxy resin with a film thickness of approximately 2.0 µm.

According to the light-emitting device 200 including the light-emitting panel 210 of the second exemplary embodiment, the following effects can be achieved.

(1) The light-emitting panel 210 of the light-emitting device 200 includes a display unit 205 including a light-emitting unit 206 in which rectangular light-emitting pixels P are arranged, and a light-blocking unit 124 arranged to surround the light-emitting unit 206. The light-blocking unit 124 is arranged to overlap with the light-emitting pixels P located at an outer edge of the light-emitting unit 206, and the boundary BL between the light-emitting unit 206 and the light-blocking unit 124 has a curved shape. Therefore, even when the rectangular light-emitting pixels P are arranged, the light-emitting unit 206 whose outer edge is a smooth circular shape can be realized. Further, the size of the light-emitting pixels P overlapping with the light-blocking unit 124 at the outer edge of the light-emitting unit 206 (light-emitting region E1) is the same as the size of the light-emitting pixels P arranged in the light-emitting region E1. Therefore, the current value regarding light emission of the light-emitting pixels P overlapping with the light-blocking unit 124 at the outer edge of the light-emitting region E1 is at the same level as the current value regarding the light emission of the light-emitting pixels P in the light-emitting region E1. Thus, luminance unevenness, that is, display unevenness is unlikely to occur on the outer edge side of the light-emitting region E1. In addition, a data line driving circuit 101 and a scanning line driving circuit 102 for driving the pixel circuit 140 including the light-emitting element 150 in the light-emitting pixel P is arranged in the periphery of the display unit 205. A first data line 131a and a scanning line 132 are disposed in the display unit 205 as driving lines that electrically couple the driving circuit and the pixel circuit 140. The light-emitting unit 206 (light-emitting region E1) is circular and the display unit 205 is rectangular, thus, the shorter the part of the driving line arranged in the light-emitting region E1, the longer the part of the driving line arranged in the light-blocking region E2 becomes. In other words, for the driving line crossing the display unit 205, the length of the driving line arranged in the X direction or the length of the driving line arranged in the Y direction is constant. That is, the circular light-emitting unit 206 includes a part where the number of the light-emitting pixels P attached to the driving lines extending in the X direction or the Y direction is different, but the capacitance and the resistance of the driving lines are substantially constant, thus, the light-emitting device 200 in which variations in the driving load on the driving line are reduced and the luminance unevenness between the light-emitting pixels P, that is, the display unevenness is unlikely to occur, can be provided.

(2) The cathode contact portion 208 as the second electrode contact portion is arranged with a predetermined number of dummy pixels DP interposed between the cathode contact portion 208 the circular light-emitting unit 206. Therefore, the distance between the light-emitting unit 206 and the cathode contact portion 208 is equidistant, and the wiring resistance from the cathode contact portion 208 to the cathode 153 in the light-emitting unit 206 is made uniform, thus, luminance unevenness in the light-emitting unit 206 due to variations in the wiring resistance can be further reduced.

(3) The cathode contact portion 208 is formed to imitate the structure of the light-emitting element 150 in the light-emitting pixels P, and includes an electrode 151b formed in the same layer as the anode 151 of the light-emitting element 150. The electrode 151b is coupled to the cathode 153 at the opening part 154c of the insulating film 154 formed on the electrode 151b. Further, the electrode 151b is coupled to the cathode wiring 139 of the circuit unit 140 via the circuit portion 151c. The cathode electrode potential VCT is applied to cathode wiring 139. Therefore, when forming the anode 151, the electrode 151b that configures the cathode contact portion 208 can be formed, thus the manufacturing process is not complicated, and a light-emitting device 200 having a simple configuration can be provided.

(4) The dummy pixels DP are provided between the cathode contact unit 208 and the outer edge of the region where the plurality of light-emitting pixels P of the light-emitting unit 206 is arranged. The light-emitting function layer 152 is formed across the dummy pixels DP and the region where the plurality of light-emitting pixels P is arranged in the light-emitting unit 206. An outer edge of the light-emitting function layer 152 is located between the dummy pixels DP and the cathode contact portion 208. Thus, when forming the light-emitting function layer 152, even the film thickness on the outer edge side of the light-emitting function layer 152 fluctuates, such variation in film thickness can be prevented from affecting the light-emitting unit 206. That is, by providing the dummy pixels, the film thickness of the light-emitting function layer 152 in the light-emitting unit 206 can be made uniform, thus the luminance unevenness in the light-emitting unit 206 due to variations in the film thickness of the light-emitting function layer 152 can be further reduced. In addition, the anode 151 of the light-emitting element 150 in the dummy pixel DP is covered by the insulating film 154, thus, the anode 151 and the light-emitting function layer 152 are isolated and are non-emitting. That is, the configuration is such that light emission is not generated unexpectedly in the dummy pixels DP.

(5) The color filter 123 is arranged on the sealing film 122 covering the light-emitting element 150, and the light-blocking unit 124 surrounding the light-emitting unit 206 is configured by overlapping with the colored layers 123G, 123B, and 123R of a plurality of colors. Therefore, while color display can be achieved in the light-emitting unit 206, and the light-blocking unit 124 is arranged close to the light-emitting element 150, thus, light emitted from the light-emitting element 150 located at the outer edge of the light-emitting unit 206 in an oblique direction with respect to the normal direction is reliably blocked by the light-blocking unit 124. In other words, a light-emitting device 200 capable of displaying a good-looking color can be provided.

Third Exemplary Embodiment

Electronic Apparatus

Figure 14:
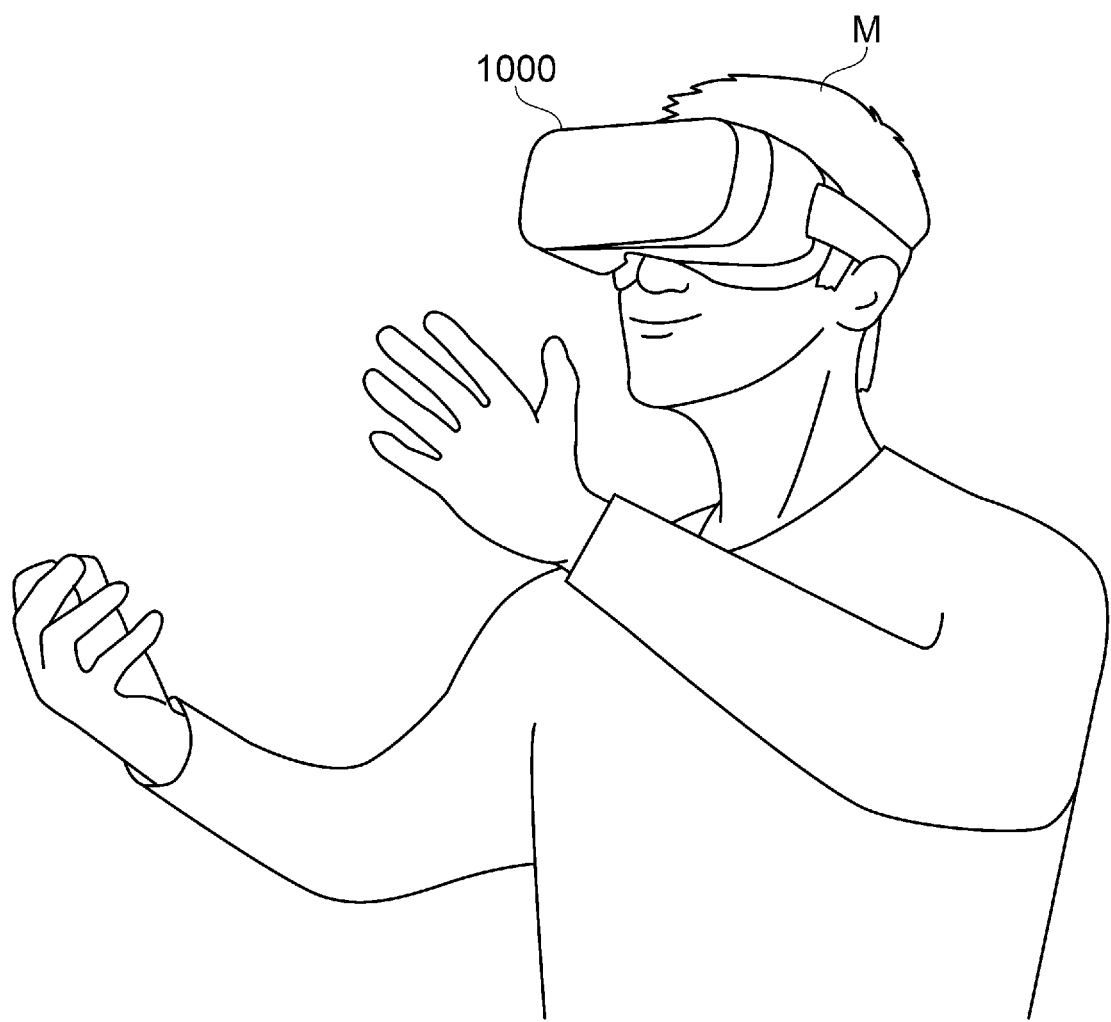
FIG. 14 is a schematic diagram illustrating the structure of a head-mounted display serving as an electronic apparatus according to a third exemplary embodiment.

Next, an example of an electronic apparatus to which the light-emitting device 100 of the first embodiment is applied will be described with reference to FIG. 14 and FIG. 15. FIG. 14 is a perspective view illustrating a head-mounted display as an electronic apparatus according to a third exemplary embodiment, and FIG. 15 is a schematic plan view illustrating an arrangement of light-emitting devices in the head-mounted display of the third exemplary embodiment.

As illustrated in FIG. 14, a head-mounted display (HMD) 1000 as an electronic apparatus of the present exemplary embodiment is a Virtual Reality (VR)-type display system that has a goggle-like form which is worn on a head of a user M to cover both eyes and to block external light, and enjoys displayed virtual reality image, for example.

Figure 15:
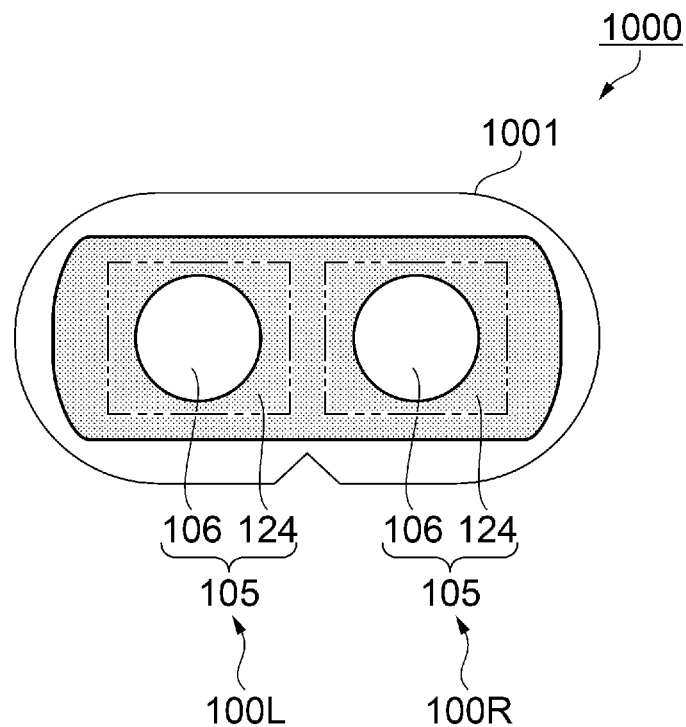
FIG. 15 is a schematic plan view illustrating an arrangement of a light-emitting device in a head-mounted display of the third exemplary embodiment.

As illustrated in FIG. 15, the light-emitting device 100 of the first exemplary embodiment is provided respectively as a left eye and a right eye in a hood 1001 that covers both eyes of HMD 1000. Hereinafter, the left eye is referred to as a light-emitting device 100L, and the right eye is referred to as a light-emitting device 100R. When mounted inside the hood 1001, the left and right light-emitting devices 100L and 100R are in a state where the display unit 105 including the light-blocking unit 124 other than the light-emitting unit 106 and the peripheral unit are covered by the light-blocking member. The light-emitting unit 106 is circular so as to cover the viewing angle range corresponding to the left eye and the right eye.

The HMD 1000 includes a controller (not illustrated) for causing an image to be displayed on each of the left and right light-emitting devices 100L and 100R. The controller includes a built-in storage medium for storing image, audio, and the like to be displayed, and is capable of inputting image signals and the like from outside. Further, the controller is also capable of wired or wireless connection to an external network. That is, various image sources can be used to enjoy images, audio, music, and the like attached to the image.

The HMD 1000 of the present exemplary embodiment includes a pair of light-emitting devices 100L and 100R corresponding to the left eye and the right eye, and the outer edge of the light-emitting unit 106 (light-emitting region E1) is a smooth circle. Thus, the arrangement of the light-emitting pixels P are such that an outer edge of the displayed image may not have a stepped shape and display unevenness due to luminance unevenness is unlikely to occur. Further, light leakage from the light-blocking unit 124 other than the light-emitting unit 106 is prevented. Thus, by mounting the HMD 1000, the user M can immerse and view the image displayed in the light-emitting unit 106.

Note that, the human has an angle of view range of approximately 150 degrees in the horizontal direction and approximately 130 degrees in the vertical direction, thus, in order to ensure immersion, the image may be visible in an angle range of not less than 100 degrees in the horizontal direction and the vertical direction, respectively. Accordingly, the light-emitting unit 106 may be configured to adjust the size of the light-emitting unit 106 and arrange an optical element such as a lens corresponding to each of the left and right light-emitting units 106 in order to make the image in the light-emitting unit 106 visible in an angular range of not less than 100 degrees.

Further, in HMD 1000, the pair of display devices provided corresponding to the left eye and the right eye is not limited to the light-emitting device 100 of the first exemplary embodiment, and similar effects can be obtained by applying the light-emitting device 200 of the second exemplary embodiment.

Note that, the present disclosure is not limited to the exemplary embodiments described above, and the exemplary embodiments described above can be variously changed and modified. Modified examples will be described below.

Modified Example 1

Figure 16:
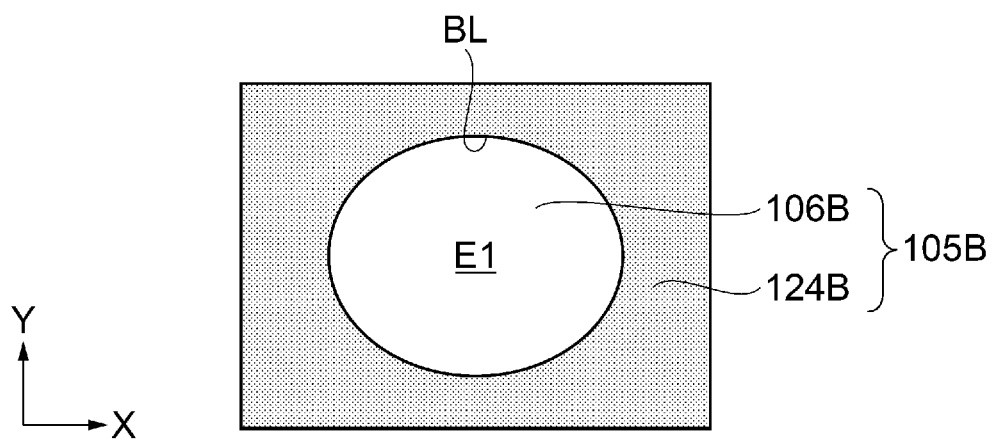
FIG. 16 is a schematic plan view illustrating a display unit of a modified example of the light-emitting device.
Figure 17:
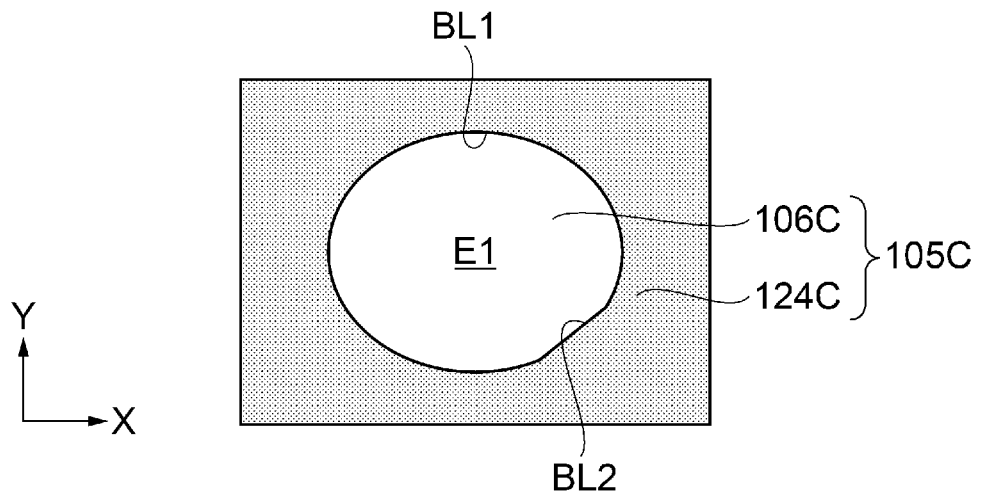
FIG. 17 is a schematic plan view illustrating a display unit of a modified example of the light-emitting device.
Figure 18:
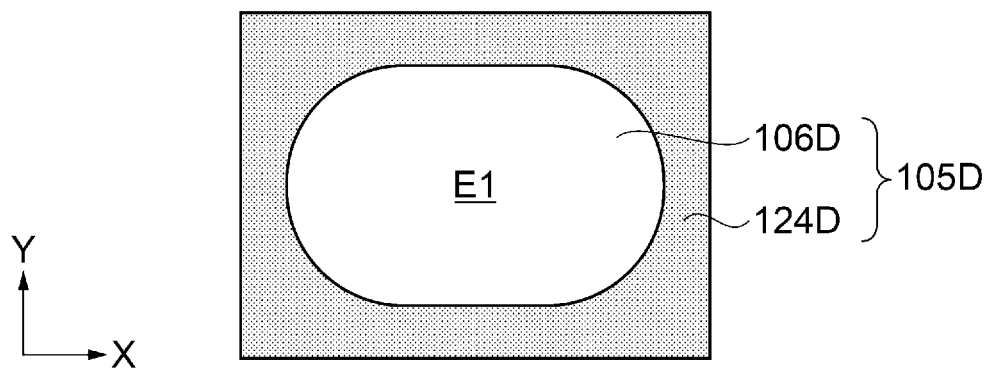
FIG. 18 is a schematic plan view illustrating a display unit of a modified example of the light-emitting device.

The outline of the light-emitting unit 106 (light-emitting region E1) of the light-emitting device 100 of the first exemplary embodiment is not limited to being circular, and it is sufficient that at least a part of the boundary between the light-emitting region E1 and the light-blocking unit 124 has a curved shape. FIG. 16 to FIG. 18 are schematic plan views illustrating display units of modified examples of the light-emitting device.

For example, as illustrated in FIG. 16, a display unit 105B includes a light-emitting unit 106B in which rectangular light-emitting pixels P are arranged, and a light-blocking unit 124B surrounding the light-emitting unit 106B. A boundary BL between the light-emitting unit 106B and the light-blocking unit 124B is smooth curvilinear, and an outline of the light-emitting unit 106B (light-emitting region E1) is elliptical.

Further, the outline of the light-emitting unit 106 may not all be curvilinear. For example, as illustrated in FIG. 17, a display unit 105C includes a light-emitting unit 106C in which rectangular light-emitting pixels P are arranged, and a light-blocking unit 124C surrounding the light-emitting unit 106C. A boundary between the light-emitting unit 106C and the light-blocking unit 124C is configured by a smooth elliptical boundary BL1 and a rectilinear boundary BL2. That is, an outline of the light-emitting unit 106C (light-emitting region E1) is an elliptical shape in which a lower right part is cut obliquely. This is the display unit 105C corresponding to the light-emitting device 100L for the left eye when mounted on the HMD 1000. In the light-emitting device 100R for the right eye, an elliptical light-emitting unit 106C may be formed in which a lower left part is cut obliquely in a plan view. That is, when the light-emitting unit 106 is enlarged corresponding to both eyes, the field of view of the user M on the nose side is considered to be substantially limited, thus the light-emitting unit 106C having a corresponding shape is considered.

Further, as illustrated in FIG. 18, a display unit 105D of the modified example includes a light-emitting unit 106D in which rectangular light-emitting pixels P are arranged, and the light-blocking unit 124D surrounding the light-emitting unit 106D. In a boundary BL between the light-emitting unit 106D and the light-blocking unit 124D, the sides opposite in the X direction are arc-shaped, and the sides opposite in the Y direction are rectilinear. That is, an outline of the boundary BL between the light-emitting unit 106D and the light-blocking unit 124D is a track shape. According to this configuration, the range of viewing angle in the horizontal direction (left-right direction) can be further enlarged in comparison to the light-emitting unit 106B illustrated in FIG. 16 and the light-emitting unit 106C illustrated in FIG. 17.

Note that the outline of the light-emitting unit 206 of the second exemplary embodiment is not limited to a circular shape and may be an elliptical shape, an elliptical shape in which a part is rectilinear, or a track shape, as illustrated in modified example 1.

Modified Example 2

Figure 19:
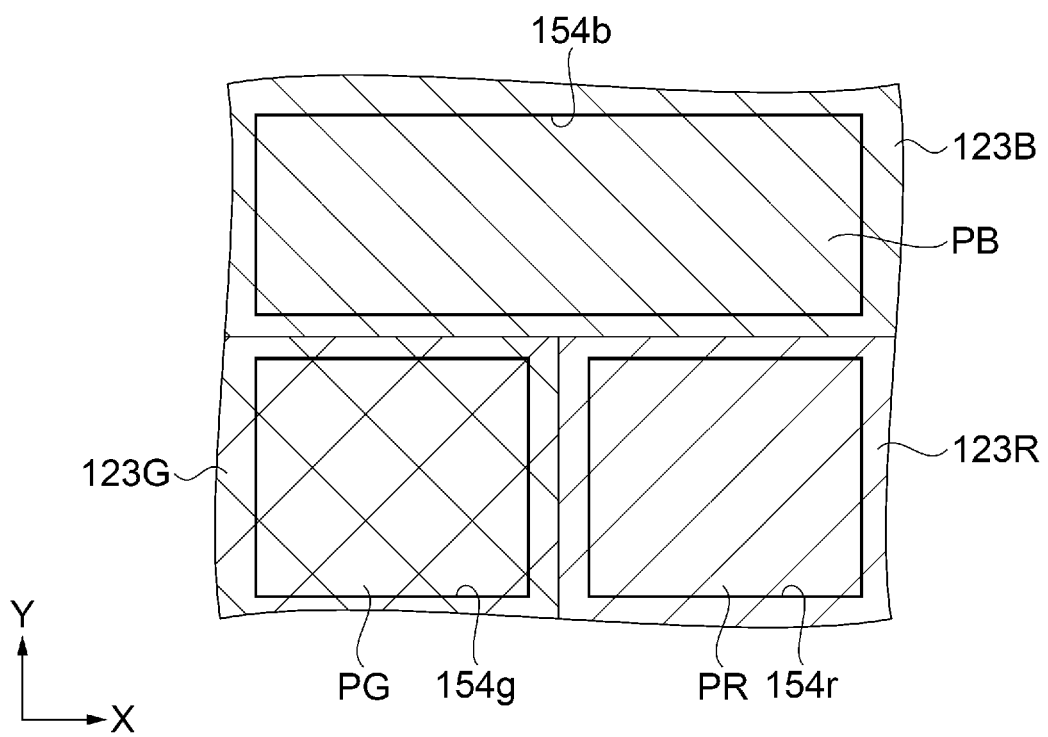
FIG. 19 is a schematic plan view schematically illustrating an arrangement of a light-emitting pixel of a modified example.

The arrangement of the light-emitting pixels PR, PG, and PB from which red (R), green (G), and blue (B) emission are obtained, in other words, the configuration of the color filter 123 corresponding to the light-emitting pixels PR, PG, and PB is not limited to a striped shape. FIG. 19 is a schematic plan view illustrating a configuration of light-emitting pixels of the modified example. As illustrated in FIG. 19, a display unit pixel of the modified example is configured by, for example, a green (G) light-emitting pixel PG and a red (R) light-emitting pixel PR disposed so as to be adjacent to each other in the X direction, and a blue (B) light-emitting pixel PB disposed so as to be adjacent to the light-emitting pixels PG and PR in the Y direction. A blue (B) colored layer 123B is arranged in the light-emitting pixel PB, a green (G) colored layer 123G is arranged in the light-emitting pixel PG, and a red (R) colored layer 123R is arranged in the light-emitting pixel PR. A pixel emission region (in other words, the pixel emission area) of the light-emitting pixel PB is defined by an opening part 154b disposed in the insulating film 154. Similarly, the pixel emission region in the light-emitting pixel PG is defined by an opening part 154g disposed in the insulating film 154, and the pixel emission region in the light-emitting pixel PR is defined by an opening part 154r provided in the insulating film 154. The shape of the display unit pixel in which the light-emitting pixels PR, PG, and PB are combined is square, and the pixel emission area of the blue (B) light-emitting pixel PB having a smaller luminous sensitivity than the other colors is the largest. According to this configuration of the light-emitting pixels PR, PG, and PB, compared to a case where the respective pixel light-emitting area is the same, the display unit pixel can have brightness and hue balance adjusted in the display.

Note that the green (G) light-emitting pixel PG and the red (R) light-emitting pixel PR may be arranged so as to be adjacent to each other in the Y direction, and the blue (B) light-emitting pixel PB may be arranged so as to be adjacent to them in the X direction. In either case, only the blue (B) colored layer 123B is arranged in a striped form.

Further, the light-emitting pixels P included in the display unit pixels are not limited to three primary colors: red (R), green (G), and blue (B), and may be configured by four color light-emitting pixels P including a color other than the three primary colors, for example, a yellow color (Y).

Modified Example 3

In the light-emitting device 100 of the first exemplary embodiment described above, one light-emitting region E1 defined by the light-blocking unit 124 is disposed in the display unit 105, but the present modified example is not limited to this. For example, when the light-emitting device 100 is applied to the HMD 1000 of the third exemplary embodiment, two light-emitting regions E1, which correspond to the left eye and the right eye, may be defined in the display unit 105 by the light blocking unit 124. Similarly, in the light-emitting device 200, two light-emitting units 206 corresponding to the left eye and the right eye may be disposed in the display unit 205.

Modified Example 4

The electronic apparatus to which the light-emitting device 100 of the first exemplary embodiment or the light-emitting device 200 of the second exemplary embodiment is applied is not limited to the HMD 1000 of the third exemplary embodiment. For example, a light-emitting device 100 or a light-emitting device 200 may be used as a display device for a personal digital assistant that is mounted on an arm.

Below, contents derived from the embodiments will be described.

The light-emitting device of the present application includes a display unit in which rectangular light-emitting pixels are arranged, and a light-shielding portion defining a light-emitting region in the display unit and shielding light in a region other than the light-emitting region of the display unit, and at least a part of a boundary between the light-emitting region and the light-shielding portion has a curved shape.

According to the configuration of the present application, even if the shape of the light-emitting pixels is rectangular, the outline of the light-emitting region may not have a stepped shape, and at least a part of the outline of the light-emitting region can be formed into a smooth curved shape. Further, the size of the light-emitting pixels overlapping the light-shielding portion at the outer edge of the light-emitting region is the same as the size of the light-emitting pixels arranged in the light-emitting region. Therefore, the current value related to light emission of the light-emitting pixels overlapping the light-shielding portion is at the same level as the current value related to light emission of the light-emitting pixels in the light-emitting region. Thus, it is possible to provide a light-emitting device in which luminance unevenness, that is, display unevenness is not likely to occur on the outer edge side of the light-emitting region.

In the light-emitting device described above, the light-emitting pixels may include light-emitting elements and a sealing film covering the light-emitting element, and the light-shielding portion may be provided at the sealing film.

According to this configuration, the light-shielding portion is disposed on the sealing film, thus, light that is emitted from the light-emitting pixels arranged at the outer edge of the light-emitting region in a direction oblique to a normal direction, and leaks outside the light-emitting region, can be reliably shielded by the light-shielding portion. In other words, it is possible to prevent the display quality from being degraded due to the light leaking outside the light-emitting region.

In the light-emitting device described above, the light-emitting pixels in the light-emitting region include colored layers in color selected from at least red, green, and blue, and arranged at the sealing film, and the light-shielding portion is formed by laminating the colored layers of a plurality of colors on the sealing film.

According to this configuration, a full-color display can be achieved in the light-emitting region, and the light-shielding portion is configured with the colored layers, thus a step of newly forming the light-shielding portion is unnecessary.

In the light-emitting device described above, the light-emitting element may include a first electrode, a second electrode functioning as a common electrode, and a light-emitting function layer arranged between the first electrode and the second electrode, the light-emitting device may include a second electrode contact portion outside a region in which the light-emitting pixels are arranged.

According to this configuration, a predetermined potential can be supplied to the second electrode as the common electrode in the light-emitting pixels via the second electrode contact portion.

Further, in the light-emitting device described above, the second electrode contact portion may be equidistantly arranged from the light-emitting pixels arranged at an outer peripheral side of the light-emitting region.

According to this configuration, wiring resistance from the second electrode contact portion to the second electrode is made uniform, thus the luminance unevenness in the light-emitting pixels in the light-emitting region due to variations in the wiring resistance can be further reduced.

Further, in the light-emitting device described above, the second electrode contact portion may include an electrode provided at a layer where the first electrode of the light-emitting device is disposed, and the electrode and the second electrode may be in contact with each other with the second electrode contact portion.

According to this configuration, when forming the first electrode, the electrode constituting the second electrode contact portion can be formed, thus, the manufacturing process is not complicated, and a light-emitting device having a simple configuration can be provided.

In the light-emitting device described above, the display unit may include a dummy pixel arranged between an outer edge of the region in which the light-emitting pixels are arranged and the second electrode contact portion and the dummy pixel may include the light-emitting element same as that of the light-emitting pixel, and has an insulating film disposed between the first electrode and the light-emitting function layer.

This configuration may prevent unexpected emission in the dummy pixels.

Further, in the light-emitting device described above, an outer edge of the light-emitting function layer may be located between the second electrode contact portion and an outer edge of a region in which the light-emitting pixel is arranged.

According to this configuration, when forming the light-emitting function layer, for example, even if the film thickness on the outer edge side of the light-emitting function layer varies, the outer edge of the light-emitting function layer is arranged outside the region in which the light-emitting pixels are arranged, thus, the film thickness of the light-emitting function layer in the region in which the light-emitting pixels are arranged can be made uniform. Therefore, luminance unevenness due to variations in the film thickness of the light-emitting function layer can be further reduced.

An electronic apparatus according to the present disclosure includes the electro-optical device described above.

According to the configuration of the present application, an electronic device having excellent display quality can be provided, in which the outline of the light-emitting region contributing to display is smooth and display unevenness is unlikely to occur.

What is claimed is:

1. A light-emitting device comprising:
   a rectangular display unit including:
     a curved light-emitting region in which a light-emitting pixel that has a first electrode, a second electrode functioning as a common electrode, and a light-emitting function layer arranged between the first electrode and the second electrode is disposed;
     a light-shielding region disposed around the curved light-emitting region and that shields light in a region other than the curved light-emitting region; and
     a second electrode contact portion disposed around the curved light-emitting region, the second electrode contact portion being equidistantly arranged from an outer peripheral side of the curved light-emitting region.

2. The light-emitting device according to claim 1, further comprising:
   a sealing film covering the light-emitting pixel, wherein the light-shielding region is disposed on the sealing film.

3. The light-emitting device according to claim 2, wherein
   the light-emitting pixel in the curved light-emitting region includes a colored layer in color selected from at least red, green, and blue,
   the light-emitting pixel is arranged on the sealing film, and the light-shielding region is formed by laminating colored layers of a plurality of colors at the sealing film.

4. The light-emitting device according to claim 1, wherein the second electrode contact portion includes an electrode disposed at a layer where the first electrode of the light-emitting pixel is disposed, and the electrode and the second electrode are in contact with each other with the second electrode contact portion.

5. The light-emitting device according to claim 1, wherein the rectangular display unit includes a dummy pixel arranged between the second electrode contact portion and an outer edge of the curved light-emitting region, and the dummy pixel includes a light-emitting pixel that corresponds to the light-emitting pixel in the curve light-emitting region, and has an insulating film disposed between the first electrode and the light-emitting function layer.

6. The light-emitting device according to claim 5, wherein an outer edge of the light-emitting function layer is located between the second electrode contact portion and the outer edge of the curved light-emitting region.

7. An electronic apparatus comprising the light-emitting device according to claim 1.

* * * * *